United States Patent
Hurni et al.

(10) Patent No.: US 9,917,227 B1
(45) Date of Patent: Mar. 13, 2018

(54) CONTROLLING OXYGEN CONCENTRATION LEVELS DURING PROCESSING OF HIGHLY-REFLECTIVE CONTACTS

(71) Applicant: SORAA, INC., Fremont, CA (US)

(72) Inventors: Christophe Hurni, Fremont, CA (US); Remi Delille, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 14 days.

(21) Appl. No.: 14/697,390

(22) Filed: Apr. 27, 2015

Related U.S. Application Data

(60) Provisional application No. 61/989,693, filed on May 7, 2014.

(51) Int. Cl.
| | |
|---|---|
| G01R 31/26 | (2014.01) |
| H01L 21/66 | (2006.01) |
| H01L 33/00 | (2010.01) |
| H01L 33/40 | (2010.01) |

(52) U.S. Cl.
CPC ...... H01L 33/0095 (2013.01); H01L 33/0075 (2013.01); H01L 33/405 (2013.01); *H01L 2933/0016* (2013.01)

(58) Field of Classification Search
CPC ... B60J 3/04; G02B 1/02; G02B 5/208; G02B 5/23; C01B 13/00; C01B 13/02; C01B 13/0281; H01L 31/186; H01L 27/14698; H01L 51/5259; H01L 33/0062–33/0079; H01L 33/0025; H01L 33/002; H01L 33/30–33/325; H01L 33/08; H01L 27/15–27/156; H01L 33/58–33/60; H01L 2933/0058; H01L 2924/12042; H01L 51/504–51/5044
See application file for complete search history.

(56) References Cited

U.S. PATENT DOCUMENTS

| | | | |
|---|---|---|---|
| 2011/0136273 A1* | 6/2011 | Choy | H01L 33/405 438/26 |
| 2012/0049188 A1* | 3/2012 | Park | H01L 21/3226 257/52 |
| 2015/0340563 A1* | 11/2015 | Choy | H01L 21/28575 257/98 |

* cited by examiner

*Primary Examiner* — Julio J Maldonado
*Assistant Examiner* — Stanetta Isaac
(74) *Attorney, Agent, or Firm* — Saul Ewing Arnstein & Lehr LLP

(57) ABSTRACT

Techniques for controlling oxygen concentration levels during annealing of highly-reflective contacts for LED devices together with lamps, LED device and method embodiments thereto are disclosed.

22 Claims, 29 Drawing Sheets

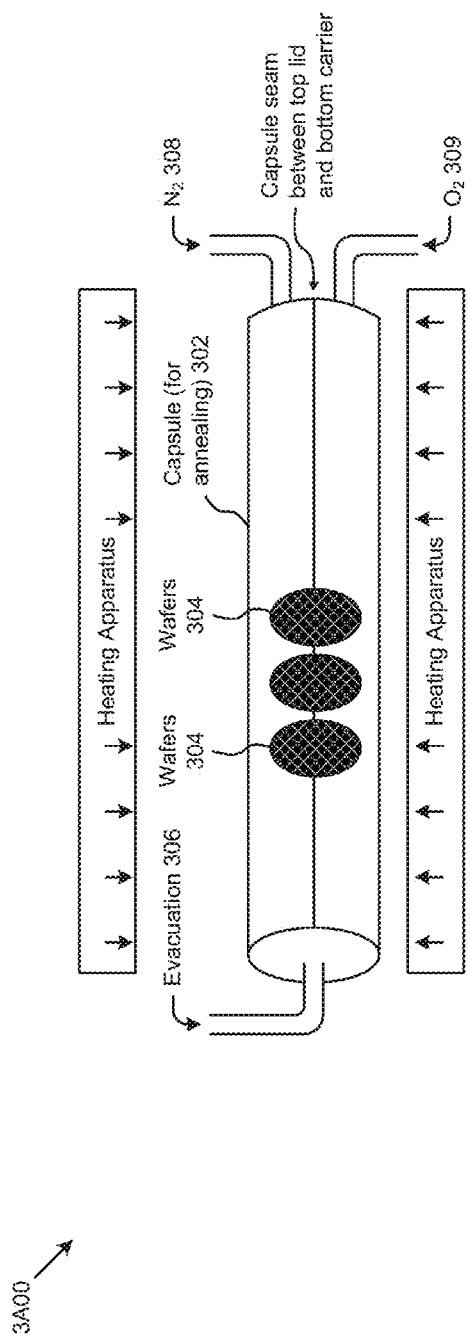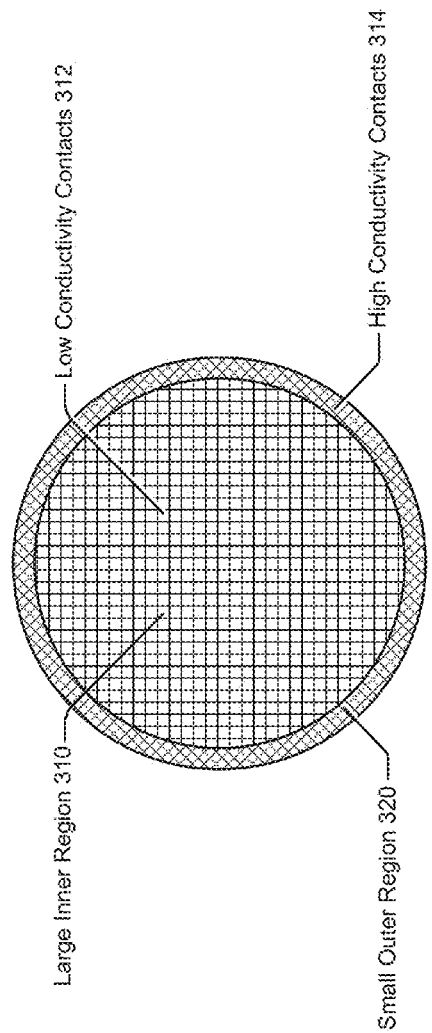
FIG. 3A
FIG. 3B

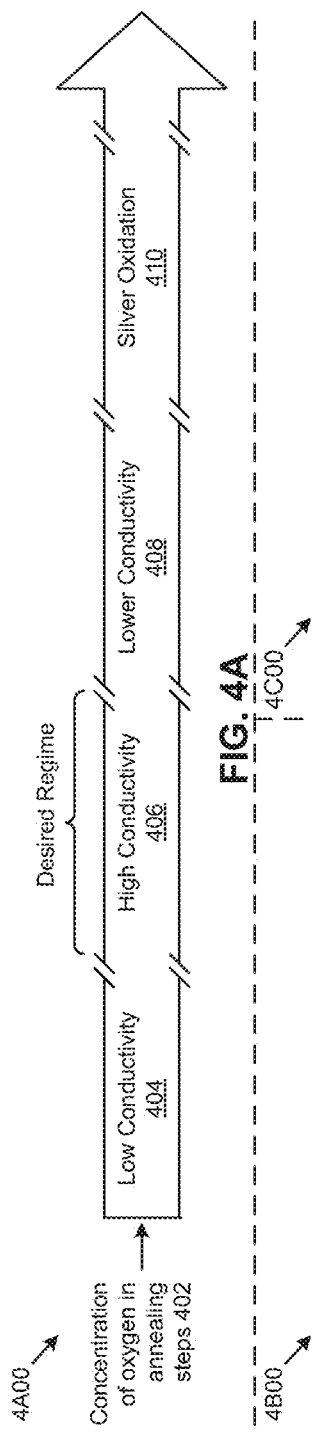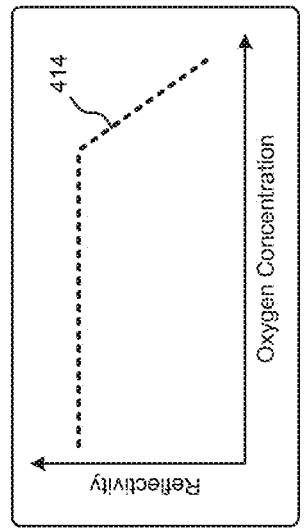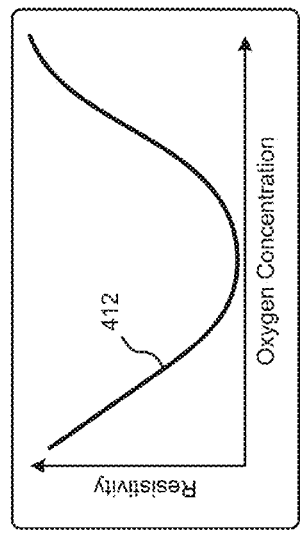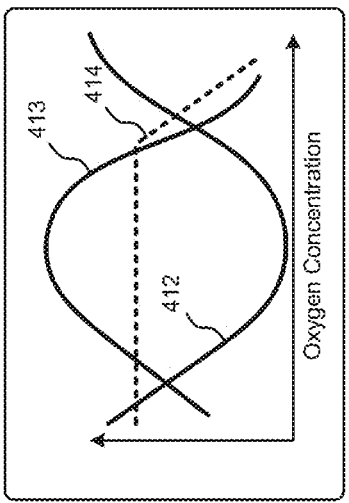

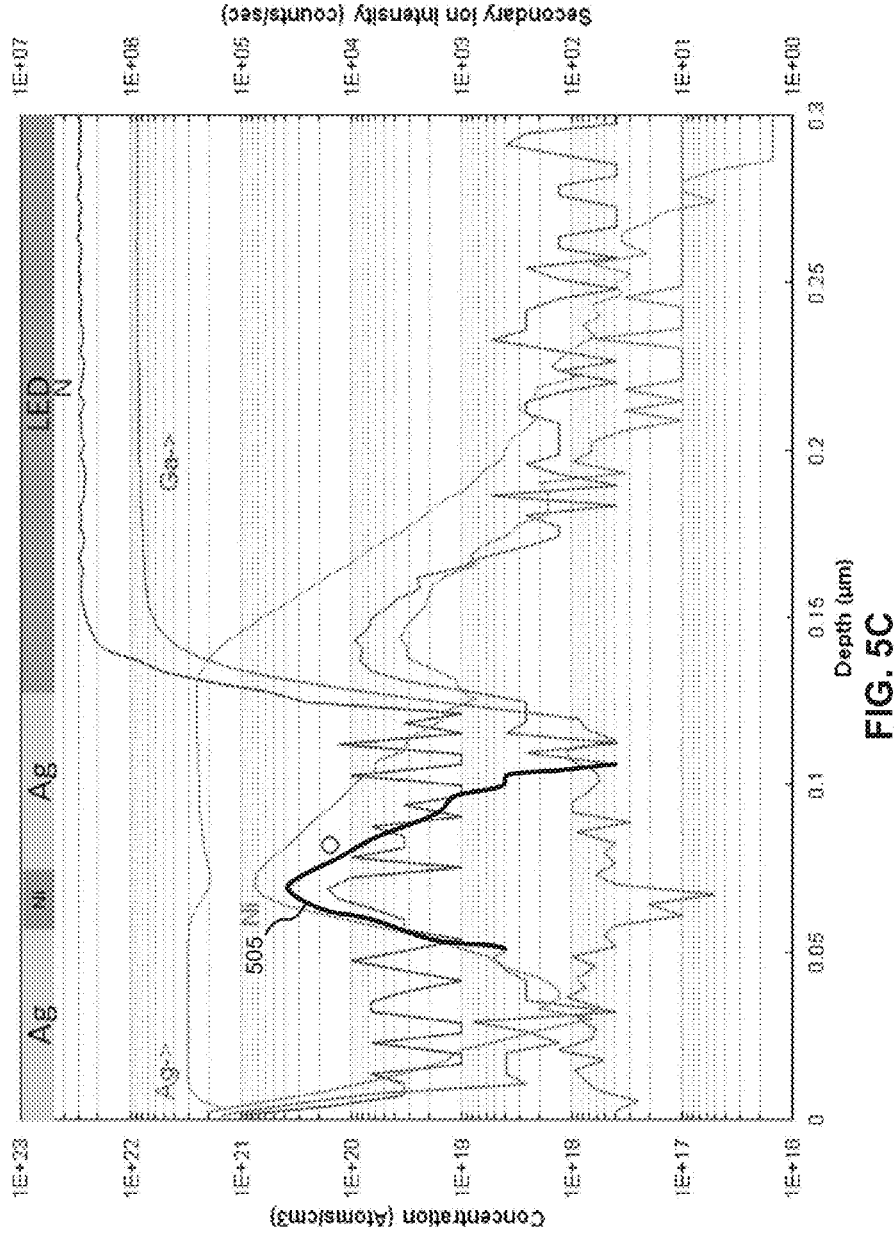

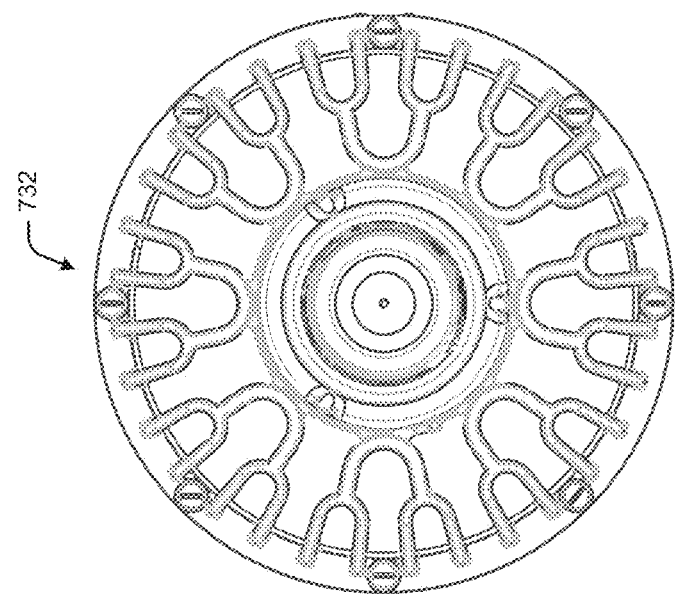
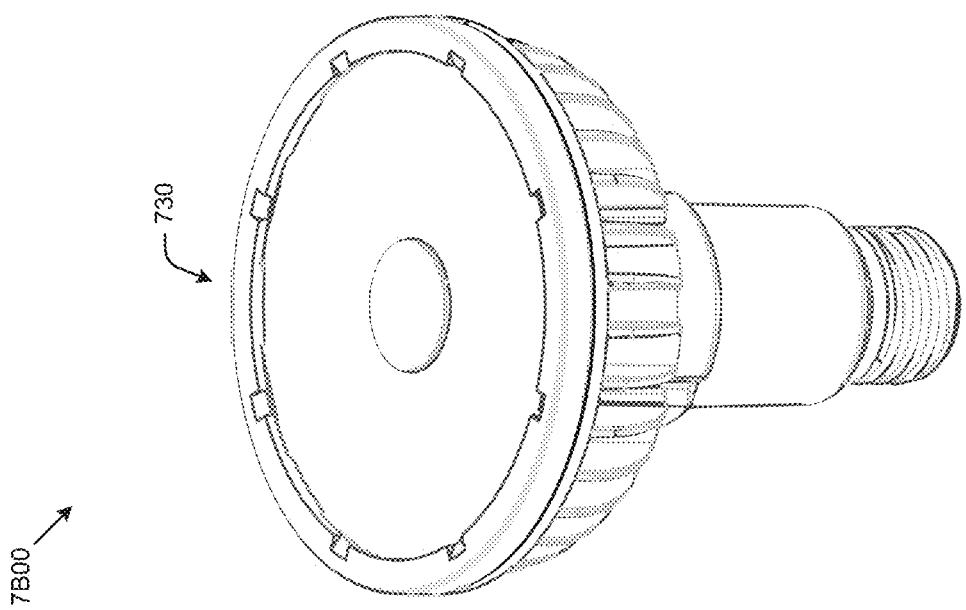
FIG. 7B

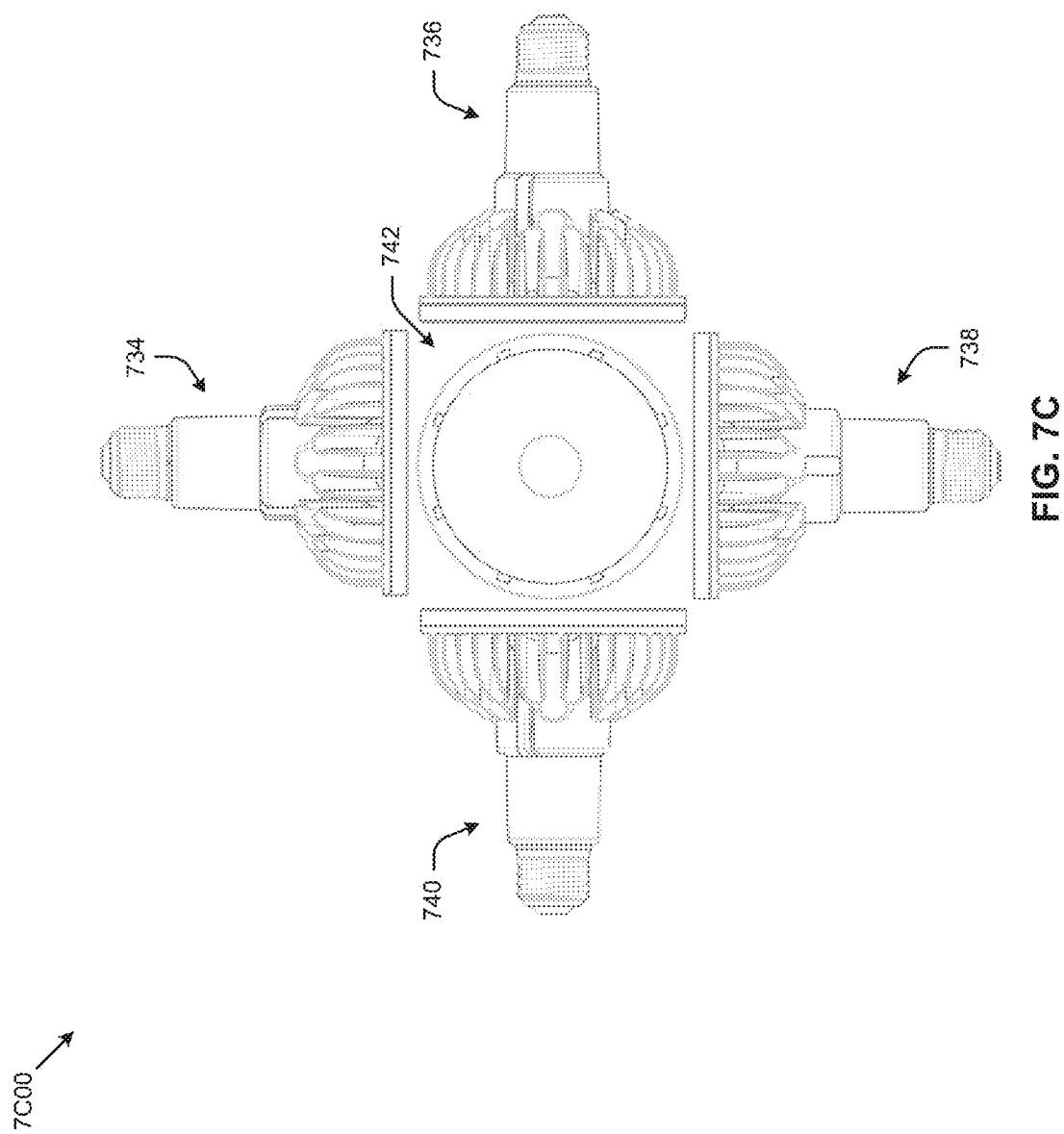

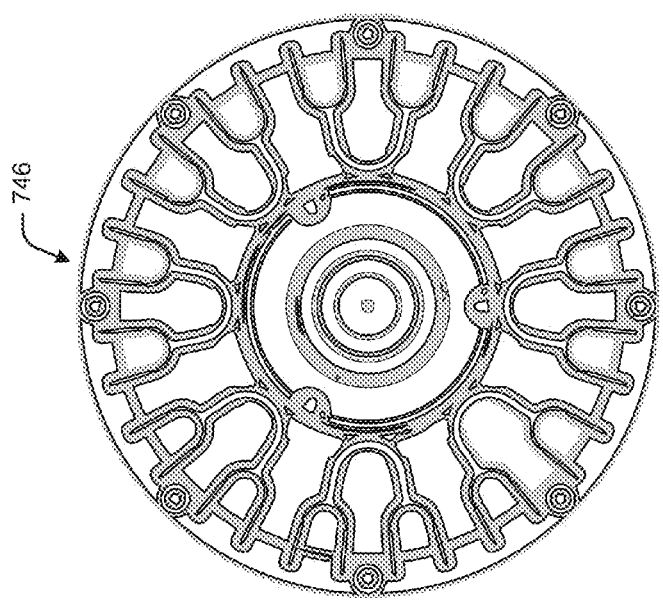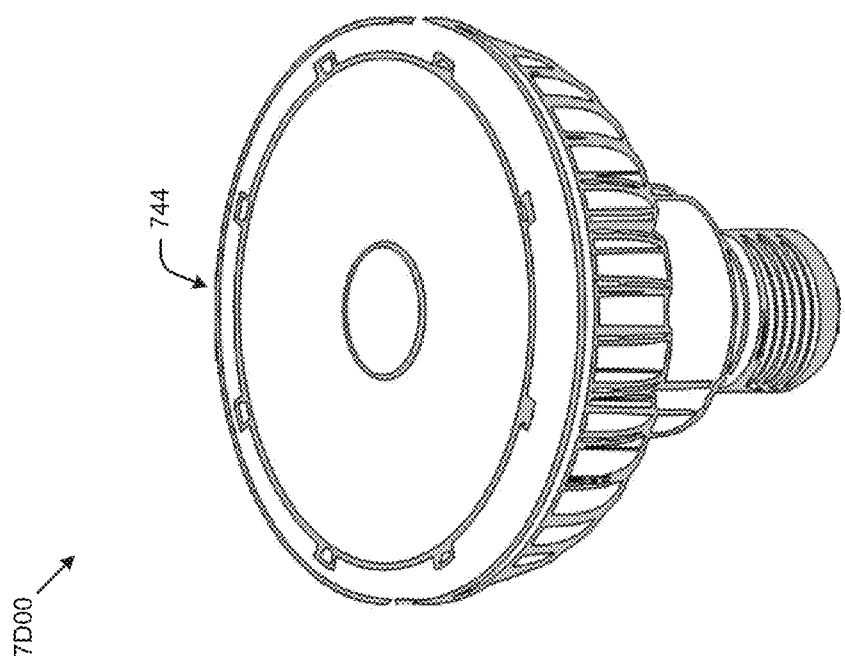
FIG. 7D

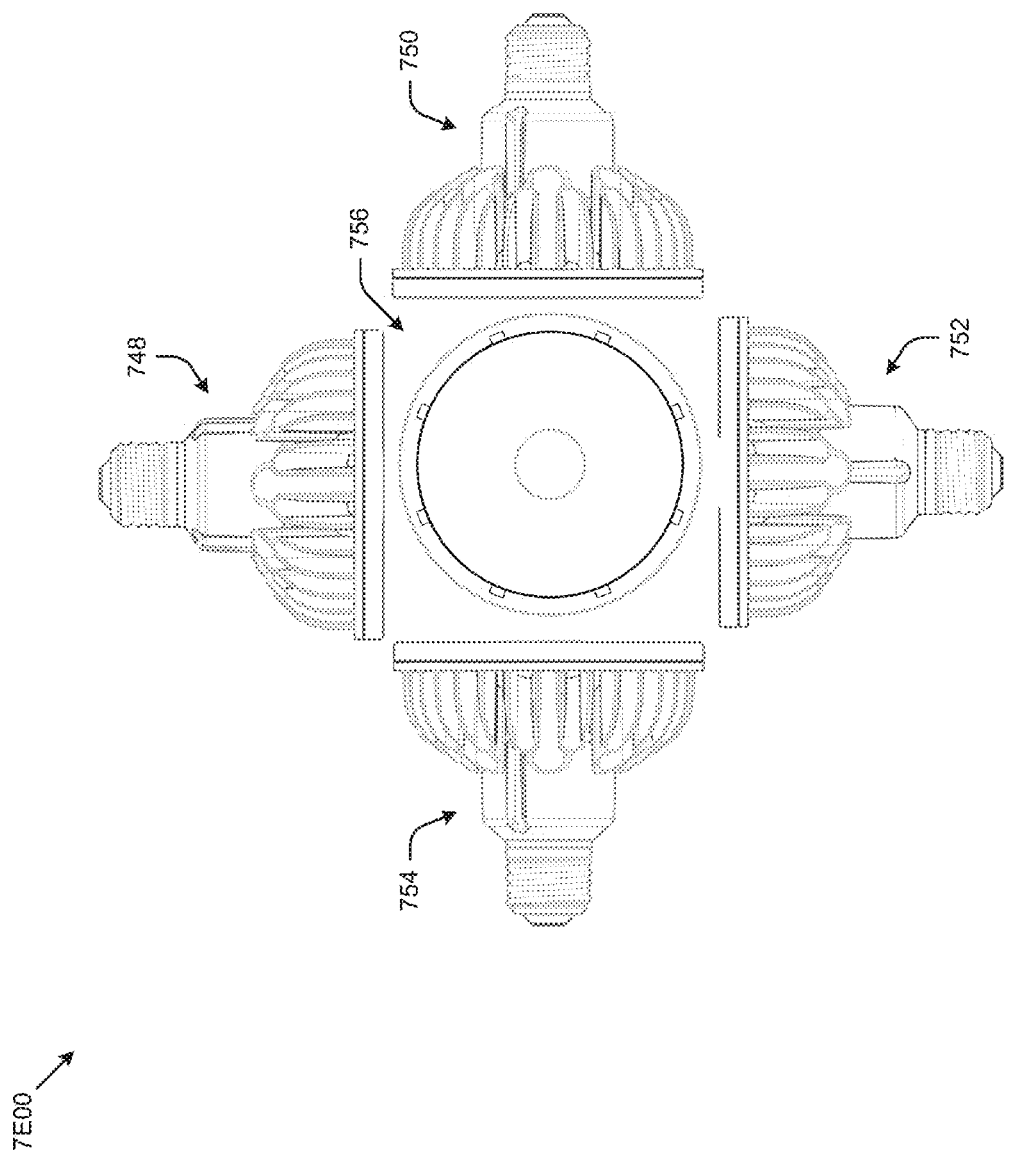

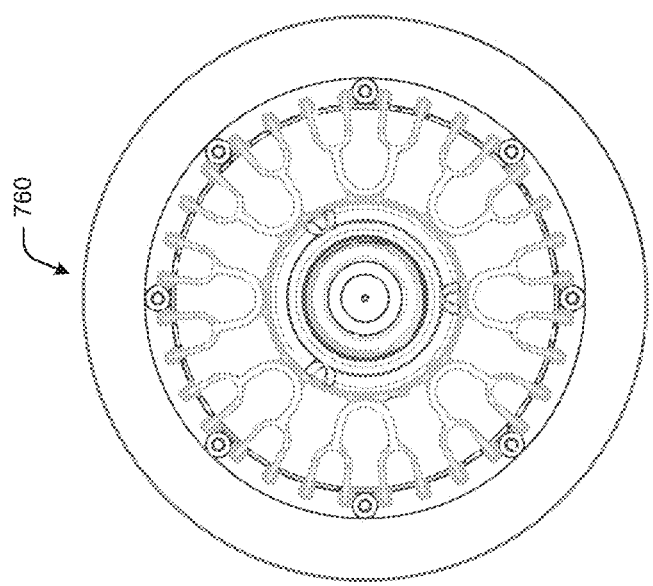
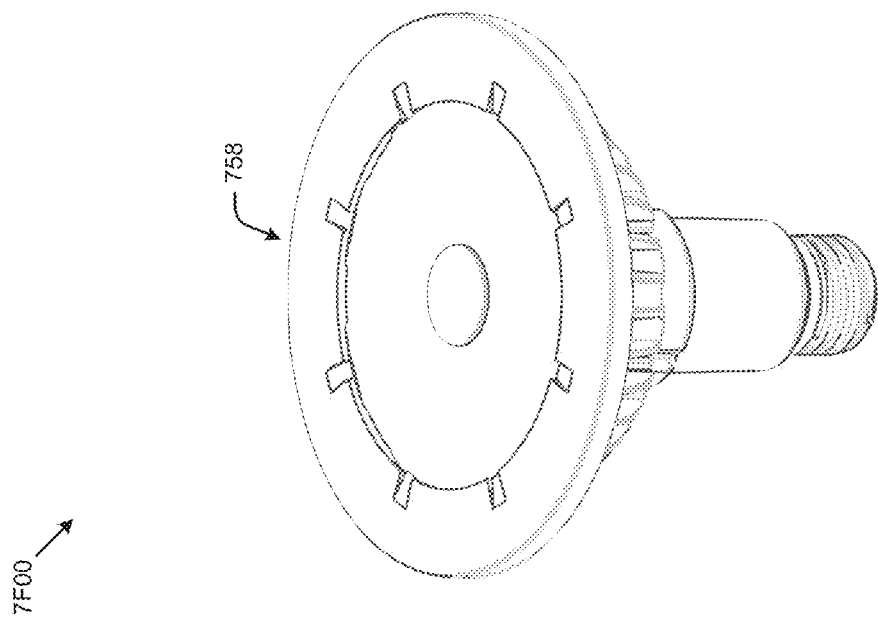
FIG. 7F

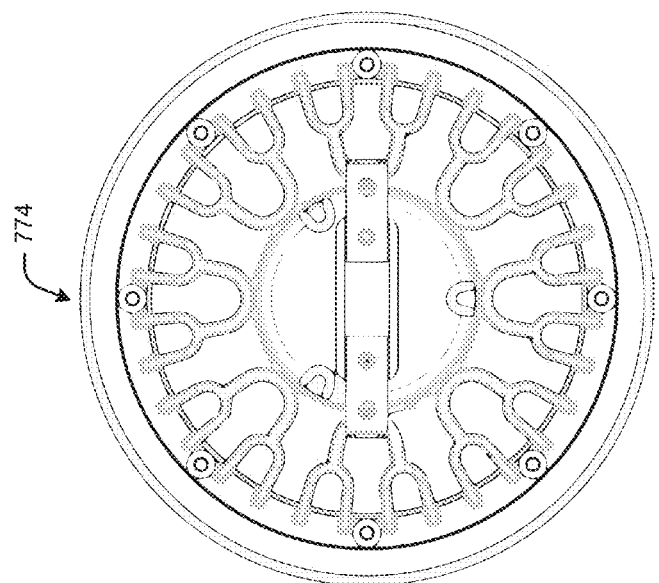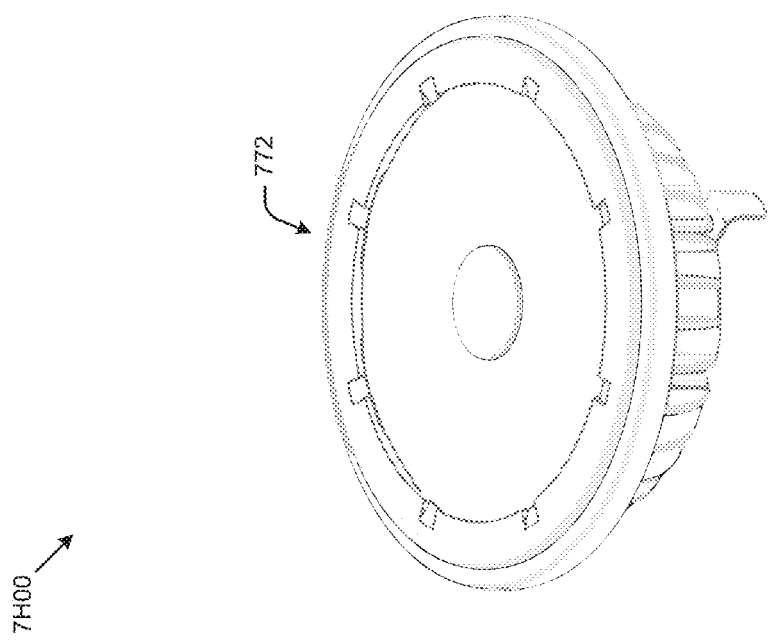
FIG. 7H

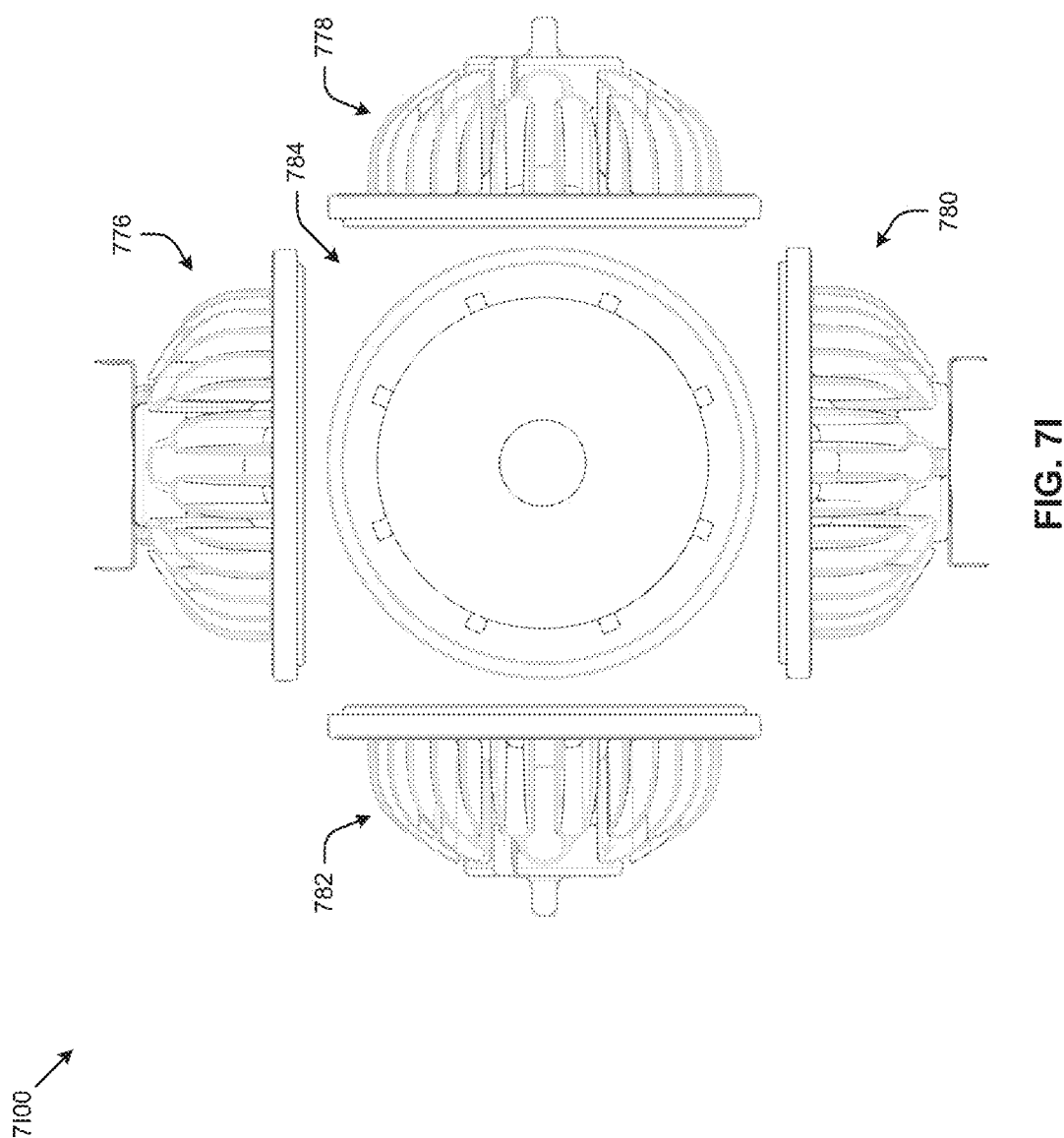

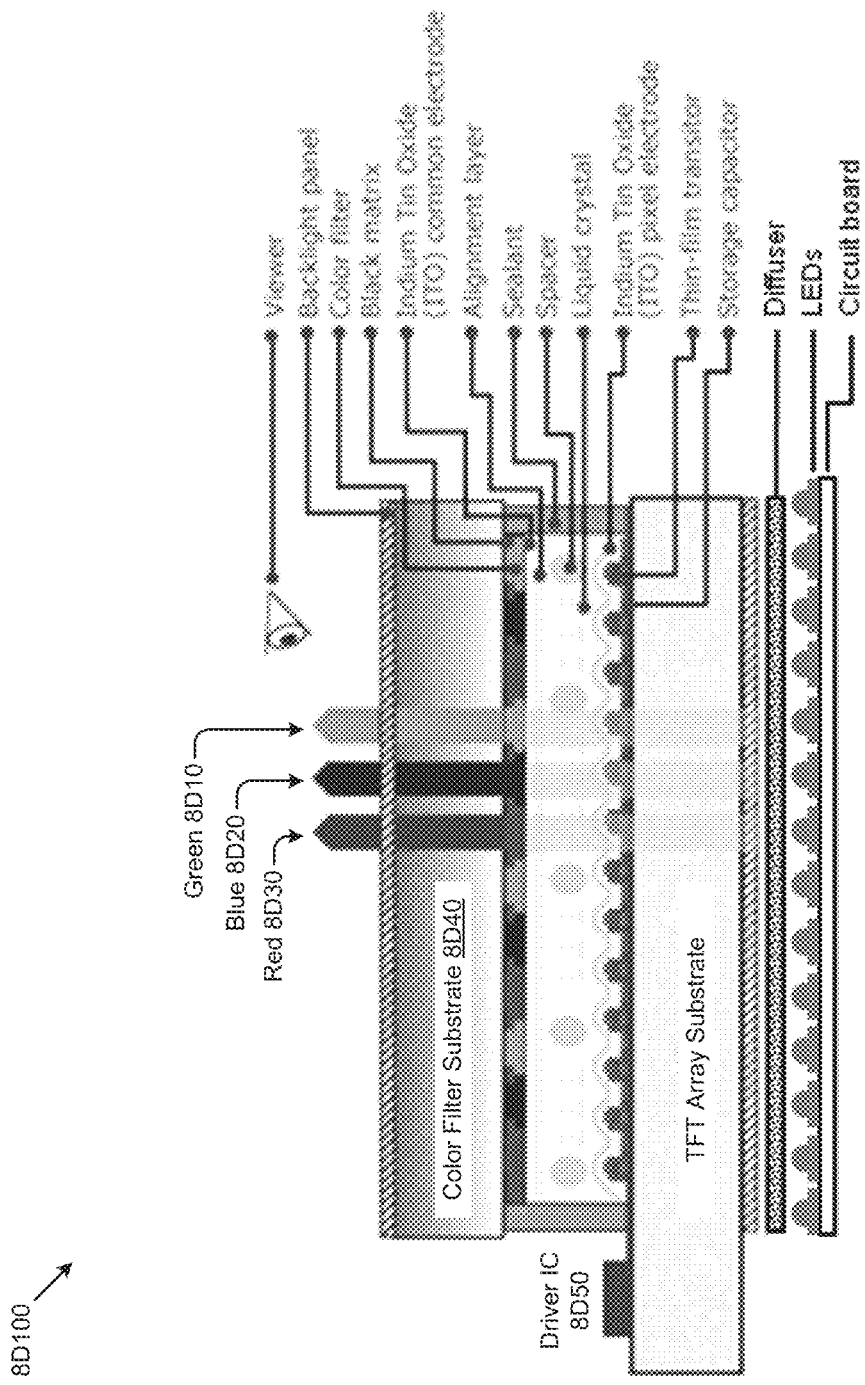
FIG. 8D1

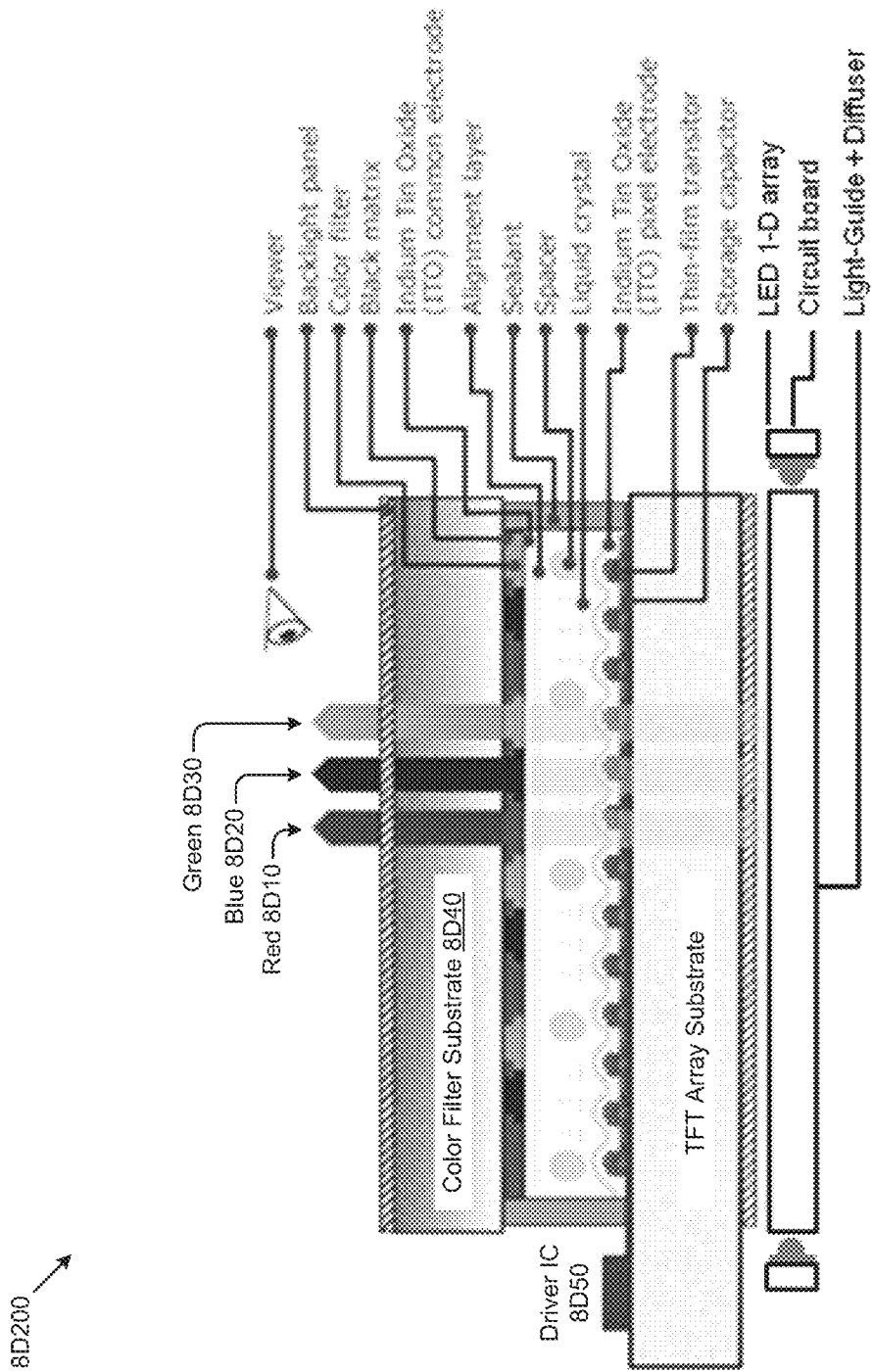
FIG. 8D2

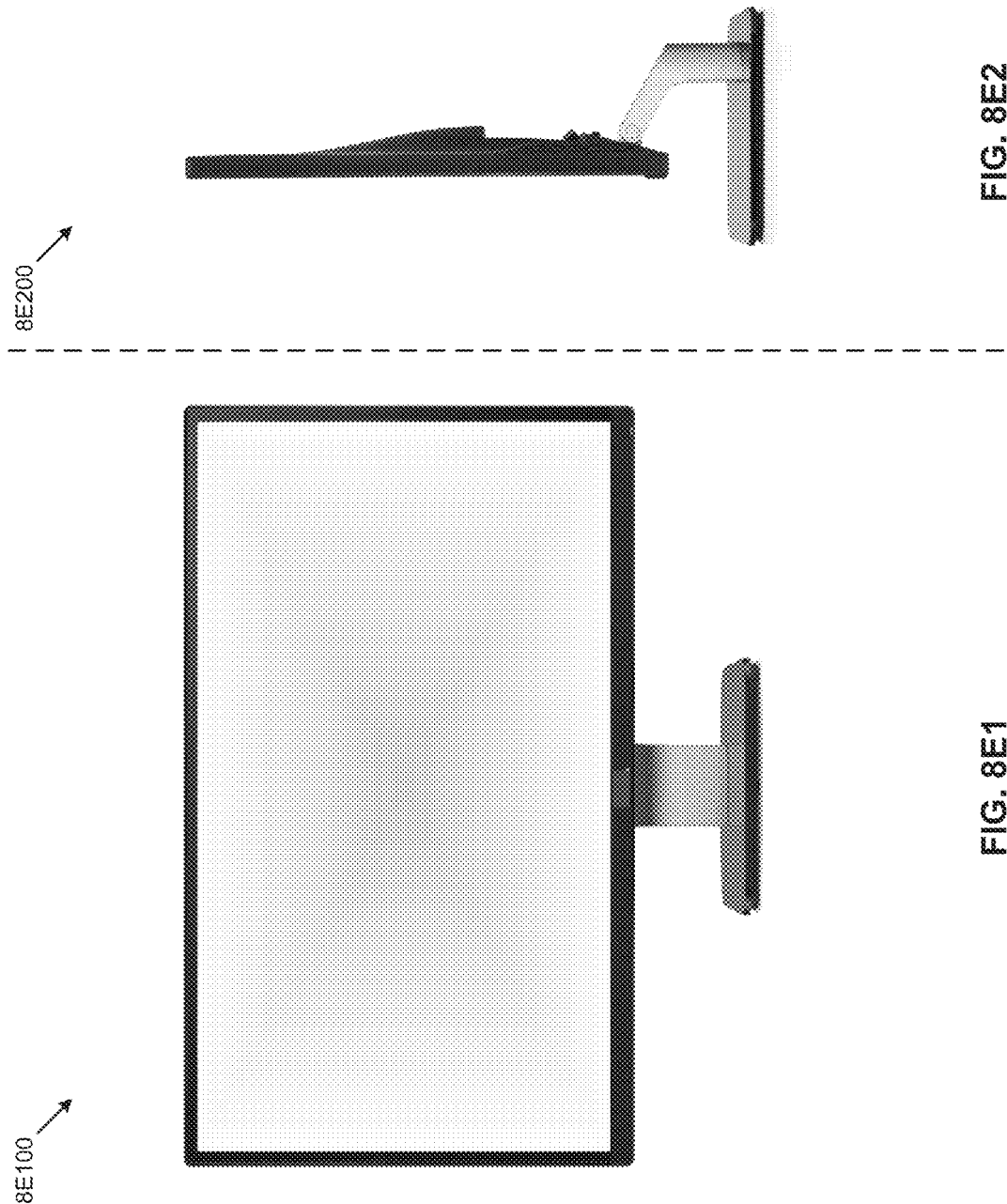

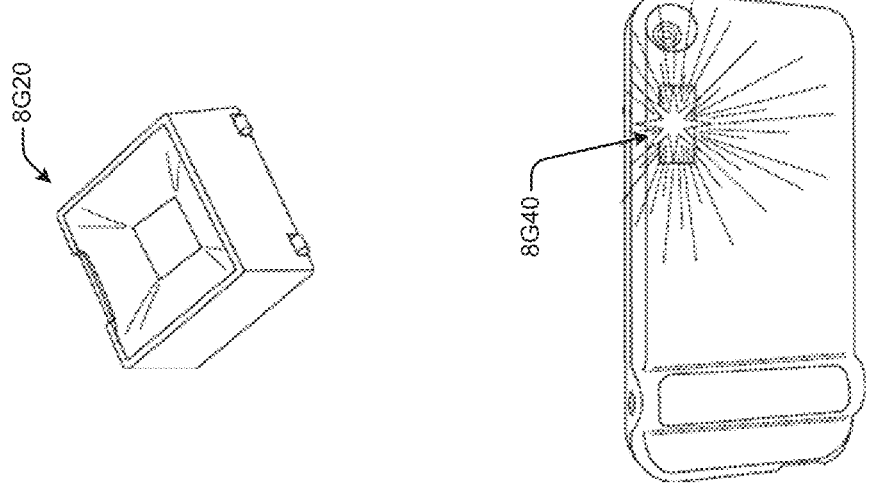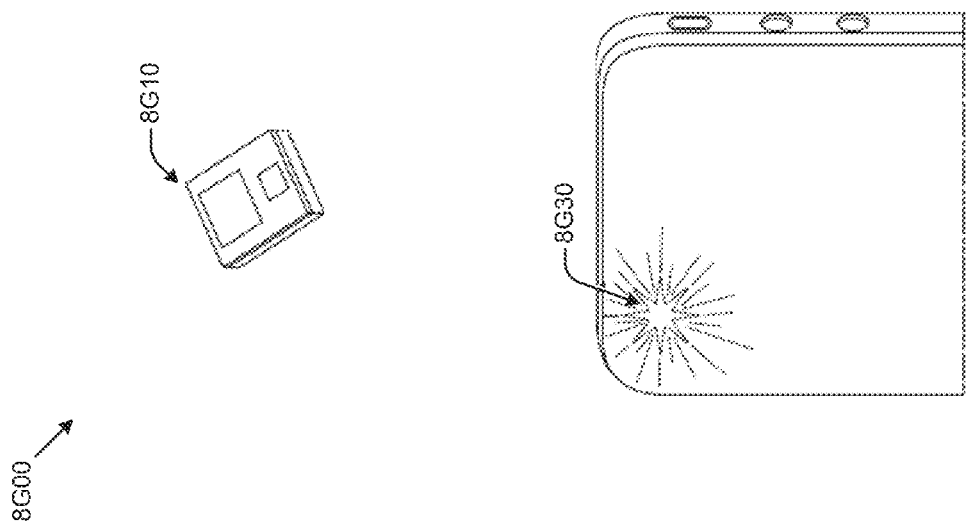
FIG. 8G

US 9,917,227 B1

CONTROLLING OXYGEN CONCENTRATION LEVELS DURING PROCESSING OF HIGHLY-REFLECTIVE CONTACTS

This application claims the benefit under 35 U.S.C. § 119(e) to U.S. Provisional Application No. 61/989,693 filed on May 7, 2014, which is incorporated by reference in its entirety.

FIELD

The disclosure relates to the field of manufacture and use of light-emitting diodes and more particularly to techniques for controlling oxygen concentration levels during processing of highly-reflective contacts.

BACKGROUND

In the manufacture of LEDs, especially flip-chip designs, it is advantageous to produce contacts that are both electrically conductive (to provide current to the device) as well as reflective (to allow photons to bounce away from the device). Deposition techniques are used for the formation of these contacts, and the deposition process is often well controlled for the deposition of high quality metals films. Furthermore, conditions are established and/or controlled so as to deposit materials (e.g., metals) in precise composition and thicknesses. It is known that some metal-semiconductor contacts exhibit high resistance (e.g., after deposition) and some properties of the metal-semiconductor contacts are improved in an annealing step (e.g., to increase electrical conductivity). Some legacy techniques go to great lengths to eliminate the presence of oxygen in both the deposition and the annealing steps (e.g., since oxygen can cause a decrease in reflectivity due to oxidation of the contact material). In some legacy cases, a thin layer of Ni or other oxygen gettering material is embedded in the Ag in the hope that it may reduce the oxidation of the Ag. These legacy approaches fail to recognize that oxygen must be present in certain concentrations in order to produce a highly electrically conductive contact. Moreover, legacy techniques fail to teach how to control the oxygen concentration through the range of processing steps. Additionally, legacy techniques fail to account for desirable effects of the presence of oxygen during the processing of metal contacts to allow for high electrical conductivity.

What is needed is a technique or techniques that allow for precise control of the content (e.g., concentration) of oxygen during the processing of the metal contacts in concentrations high enough so as to maintain high electrical conductivity, yet low enough so as to avoid a decrease in reflectivity due to oxidation of the contacts. Therefore, there is a need for improved approaches.

SUMMARY

Techniques for controlling oxygen concentration levels during processing of highly-reflective contacts are disclosed whereby the following systems and methods can be embodied as described in the claims.

Further, aspects of the disclosure include control of oxygen content (e.g., concentrations) and other characteristics of the processing environment during the processing of highly conductive contacts (e.g., onto the p-type gallium- and nitrogen-containing layer) of a light-emitting diode.

BRIEF DESCRIPTION OF THE DRAWINGS

Those skilled in the art will understand that the drawings, described herein, are for illustration purposes only. The drawings are not intended to limit the scope of the present disclosure.

FIG. 3A depicts an annealing capsule fitted with fill tubes for forming an LED device by controlling oxygen concentration levels during annealing of highly-reflective contacts, according to some embodiments.

FIG. 3B depicts a wafer showing device characterization variations after experiments for controlling oxygen concentration levels during annealing of highly-reflective contacts, according to some embodiments.

FIG. 4A depicts characterization variation regimes that emerge after experiments for controlling oxygen concentration levels during annealing of highly-reflective contacts, according to some embodiments.

FIG. 4B depicts electrical resistivity variations that emerge after characterization of devices formed by varying the conditions and techniques for controlling oxygen concentration levels during annealing of highly-reflective contacts, according to some embodiments.

FIG. 4C depicts reflectivity variations that emerge after characterization of devices formed by varying the conditions and techniques for controlling oxygen concentration levels during annealing of highly-reflective contacts, according to some embodiments.

FIG. 4D depicts a chart showing device efficiency, which is a function of resistance variations and reflectivity variations as exhibited by devices formed by varying the conditions and techniques for controlling oxygen concentration levels during annealing of highly-reflective contacts, according to some embodiments.

FIG. 5C is a SIMS scan of a contact after annealing in an environment where the oxygen concentration is controlled, according to some embodiments.

FIG. 7A through FIG. 7I depict embodiments of the present disclosure in the form of lamp applications.

FIG. 8A through FIG. 8I depict embodiments of the present disclosure applied toward lighting applications.

DETAILED DESCRIPTION

Figure 1:
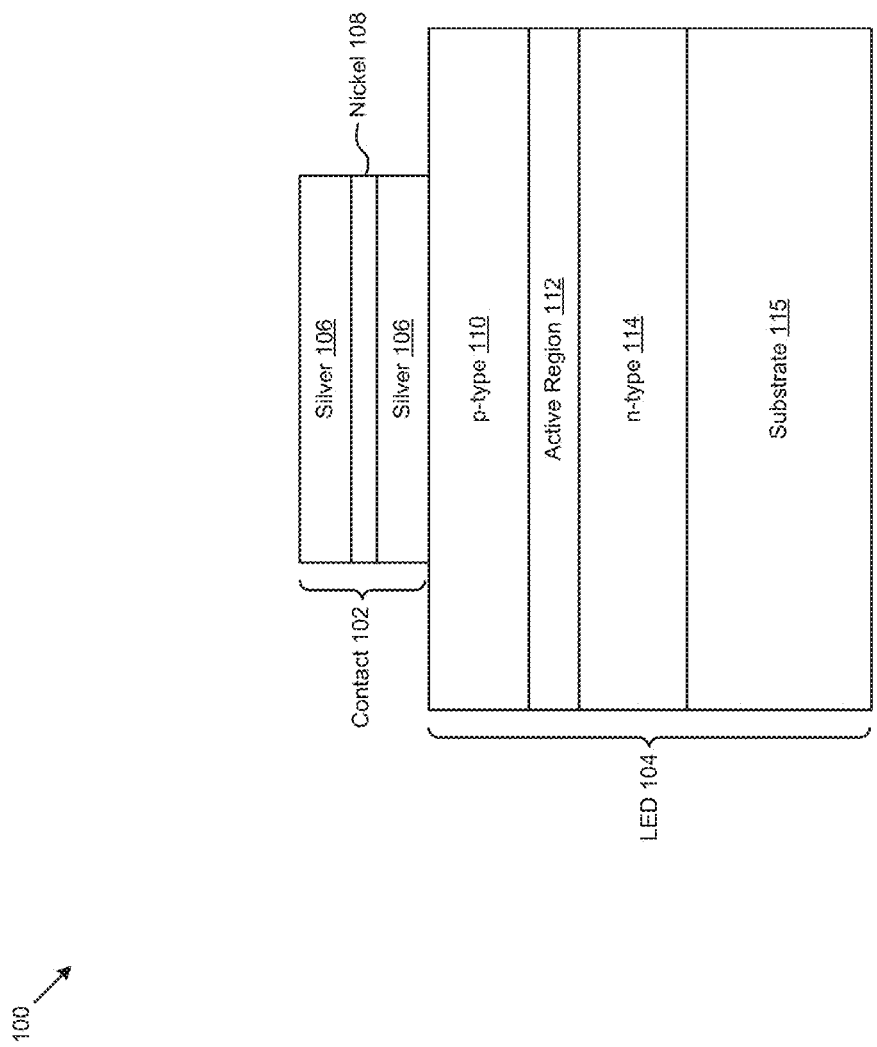
FIG. 1 is a diagram of a series of semiconductor layers having a stack of metals configured as an electrical contact that has been formed by controlling oxygen concentration levels during annealing of highly-reflective contacts, according to some embodiments.

The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. In addition, the articles "a" and "an" as used in this application and the appended claims should generally be construed to mean "one or more" unless specified otherwise or is clear from the context to be directed to a singular form.

The term "logic" means any combination of software or hardware that is used to implement all or part of the disclosure.

The term "non-transitory computer readable medium" refers to any medium that participates in providing instructions to a logic processor.

A "module" includes any mix of any portions of computer memory and any extent of circuitry including circuitry embodied as a processor.

Reference is now made in detail to certain embodiments. The disclosed embodiments are not intended to be limiting of the claims.

The compositions of matter referred to in the present disclosure comprise various compositions, some of which are described as follows:

Metal stacks for highly conductive and highly reflective contacts highly conductive contacts: Strictly as examples, highly conductive contacts can be formed of a stack or sandwich of two or more metal-containing materials. highly reflective contacts may contain Ag, Al, Au, Pt, Pd, Ni, Ge, Ti, Ru, or others depending on the wavelength range of the device. In some cases, an thin oxygen gettering material is included in the metal stack and may contain typical oxygen gettering materials such as Ni, Al, Ti, Mg, Sc, etc.

Solvents: The chemical formulation of solvents used in processing might comprise oxygen molecules, and the presence of such oxygen molecules in the solvents may influence the techniques used for controlling during processing. Strictly as examples, solvent may comprise DMSO, 1165 NMP, Acetone, etc.

The compositions of wavelength-converting materials referred to in the present disclosure comprise various wavelength-converting materials.

Wavelength conversion materials can be crystalline (single or poly), ceramic or semiconductor particle phosphors, ceramic or semiconductor plate phosphors, organic or inorganic downconverters, upconverters (anti-stokes), nanoparticles and other materials which provide wavelength conversion. Major classes of downconverter phosphors used in solid-state lighting include garnets doped at least with $Ce^{3+}$; nitridosilicates, oxynitridosilicates or oxynitridoaluminosilicates doped at least with $Ce^{3+}$; chalcogenides doped at least with $Ce^{3+}$; silicates or fluorosilicates doped at least with $Eu^{2+}$; nitridosilicates, oxynitridosilicates, oxynitridoaluminosilicates or sialons doped at least with $Eu^{2+}$; carbidonitridosilicates or carbidooxynitridosilicates doped at least with $Eu^{2+}$; aluminates doped at least with $Eu^{2+}$; phosphates or apatites doped at least with $Eu^{2+}$; chalcogenides doped at least with $Eu^{2+}$; and oxides, oxyfluorides or complex fluorides doped at least with $Mn^{4+}$. Some specific examples are listed below:

$(Ba,Sr,Ca,Mg)_5(PO_4)_3(Cl,F,Br,OH):Eu^{2+}, Mn^{2+}$
$(Ca,Sr,Ba)_3MgSi_2O_8:Eu^{2+}, Mn^{2+}$
$(Ba,Sr,Ca)MgAl_{10}O_{17}:Eu^{2+}, Mn^{2+}$
$(Na,K,Rb,Cs)_2[(Si,Ge,Ti,Zr,Hf,Sn)F_6]:Mn^{4+}$
$(Mg,Ca,Zr,Ba,Zn)[(Si,Ge,Ti,Zr,Hf,Sn)F_6]:Mn^{4+}$
$(Mg,Ca,Sr,Ba,Zn)_2SiO_4:Eu^{2+}$
$(Sr,Ca,Ba)(Al,Ga)_2S_4:Eu^{2+}$
$(Ca,Sr)S:Eu^{2+},Ce^{3+}$
$(Y,Gd,Tb,La,Sm,Pr,Lu)_3(Sc,Al,Ga)_5O_{12}:Ce^{3+}$

The Group:

$$Ca_{1-x}Al_{x-xy}Si_{1-x+xy}N_{2-x-xy}C_{xy}:A \qquad (1);$$

$$Ca_{1-x-z}Na_zM(III)_{x-xy-z}Si_{1-x+xy+z}N_{2-x-xy}C_{xy}:A \qquad (2);$$

$$M(II)_{1-x-z}M(I)_zM(III)_{x-xy-z}Si_{1-x+xy+z}N_{2-x-xy}C_{xy}:A \qquad (3);$$

$$M(II)_{1-x-z}M(I)_zM(III)_{x-xy-z}Si_{1-x+xy+z}N_{2-x-xy-2w/3}C_{xy}O_{w-v/2}H_v:A \qquad (4); \text{ and}$$

$$M(II)_{1-x-z}M(I)_zM(III)_{x-xy-z}Si_{1-x+xy+z}N_{2-x-xy-2w/3}C_{xy}O_wH_v:A \qquad (4a),$$

wherein $0<x<1$, $0<y<1$, $0 \le z<1$, $0 \le v<1$, $0<w<1$, $x+z<1$, $x>xy+z$, and $0<x-xy-z<1$, M(II) is at least one divalent cation, M(I) is at least one monovalent cation, M(III) is at least one trivalent cation, H is at least one monovalent anion, and A is a luminescence activator doped in the crystal structure.

$Ce_x(Mg,Ca,Sr,Ba)_y(Sc,Y,La,Gd,Lu)_{1-x-y}Al(Si_{6-z+y}Al_{z-y})(N_{10-z}O_z)$ (where x,y<1, y≥0 and z~1)
$(Mg,Ca,Sr,Ba)(Y,Sc,Gd,Tb,La,Lu)_2S_4:Ce^{3+}$
$(Ba,Sr,Ca)_xSi_yN_z:Eu2+$ (where 2x+4y=3z)
$(Y,Sc,Lu,Gd)_{2-n}Ca_nSi_4N_{6+n}C_{1-n}:Ce^{3+}$, (wherein $0 \le n \le 0.5$)
$(Lu,Ca,Li,Mg,Y)$ alpha-SiAlON doped with $Eu^{2+}$ and/or $Ce^{3+}$
$(Ca,Sr,Ba)SiO_2N_2:Eu^{2+},Ce^{3+}$
$(Sr,Ca)AlSiN_3:Eu^{2+}$
$CaAlSi(ON)_3:Eu^{2+}$
$(Y,La,Lu)Si_3N_5:Ce^{3+}$
$(La,Y,Lu)_3Si_6N_{ii}:Ce^{3+}$.

For purposes of the application, it is understood that when a phosphor has two or more dopant ions (i.e., those ions following the colon in the above phosphors), this is to mean that the phosphor has at least one (but not necessarily all) of those dopant ions within the material. That is, as understood by those skilled in the art, this type of notation means that the phosphor can include any or all of those specified ions as dopants in the formulation. Further, it is to be understood that nanoparticles, quantum dots, semiconductor particles, and other types of materials can be used as wavelength converting materials. The list above is representative and should not be taken to include all the materials that may be utilized within embodiments described herein.

Both highly conductive and highly reflective contacts are sought for high-power LED chips—including for flip chip designs and GaN-based LED designs—are sought for high-power LEDs. Silver (Ag) is known to have a high reflectivity in the visible spectrum. However, as-deposited Ag creates a low conductivity contact. Conventionally-annealed Ag contacts do not exhibit sufficient conductivity to enable highly-efficient and high power operation of GaN LEDs.

Un-oxidized silver has a high reflectivity in the visible spectrum making Ag the material of choice for contacts and mirrors used in certain LED designs, such as flip chip, that perform better and more efficiently when the contacts not only provide electricity to the device but also act as mirrors. In some situations, Ag contacts can suffer from poor conductivity and poor adhesion, and known-in-the-art annealing steps are performed to enhance adhesion and conductivity.

However, if the annealing step is done in the presence of air or in an environment that provides too much oxygen, the Ag contacts will oxidize and reflectivity will be dramatically decreased. To solve these issues, annealing steps can be conducted in a capsule, such as the capsule described in FIG. 3A where air is evacuated with the help of purge gases. Furthermore, it has been observed that pure Ag deposited on GaN has a tendency to roughen after annealing (e.g., due to uncontrolled grain growth during the anneal steps). The roughening is not desired as it prevents other metals from being deposited on top of and/or compromises encapsulation. Even under the best conditions found for the annealing of pure Ag, it has been observed that the resistance exhibited by the resulting contact will still not be low enough to form a high-efficiency light-emitting diode.

Substantial additional experimentation resulted in the discovery that the addition of a thin Ni layer embedded in the Ag prevented roughening after the annealing step. In experiments involving the addition of the thin Ni layer, the situation depicted in FIG. 3B is observed after annealing in a set up similar to the one showed in FIG. 3A, with only $N_2$ introduced as a purge gas and where the oxygen was not controlled. Specifically, wafers exhibit some very small-edge regions where the contacts formed exhibit electrical conductivity within acceptable ranges, yet, contacts formed in, or in a close proximity to, the large central region exhibit electrical conductivity outside of acceptable ranges. Using secondary ion mass spectroscopy (SIMS), it can be verified that the difference between the edge and central region is due to an elevated presence of oxygen where the Ni is present. Some experiments show that the $O_2$ in the edge regions are due to small leaks at the seams of capsule apparatus that inadvertently introduced oxygen. The SIMS results are given in FIG. 5A, FIG. 5B, and FIG. 5C. After this discovery, additional experiments were performed so as to determine the desirable ranges of oxygen, and still further experiments were performed so as to determine how to control oxygen concentrations in the annealing chamber. More specifically, observations from experiments and analysis therefrom result in:

Techniques to control gas flow to achieve desirable ranges of oxygen concentrations, Techniques to control oxygen introduced when using solvents, Techniques to control oxygen using gettering materials when forming highly conductive contacts, Techniques to control oxygen by interruption of the metal deposition and intentional or unintentional exposure of the oxygen gettering layer to oxygen, and Techniques to control oxygen by surface treatment of the GaN surface or by including one or many layers during the growth of the GaN that result in the release of a controlled amount of oxygen during subsequent processing.

The treatment of any of the surfaces discussed herein may be subjected to treatments that result in roughness.

Some of the disclosed techniques include a thin layer of Nickel (Ni) in the Ag contact to p-GaN (see FIG. 1). The total thickness of the first Ag layer is enough to prevent significant optical loss. In some embodiments, the total thickness of the first Ag layer is about 10 Å or greater than 100 Å or greater than 1000 Å or greater than 2000 Å. After deposition, the Ag—Ni—Ag stack is annealed. The concentrations of gasses in the annealing chamber, as well as the temperature range and timings of the anneal processes, were found to be critical. In particular, the criticality of oxygen concentration levels is discussed infra.

Contacts formed using the hereunder disclosed processes showed excellent optical and electrical properties, with a specific contact resistance of 5E-4 Ohm-cm$^2$ or lower. The adhesion of the annealed Ag—Ni—Ag is better than that of pure silver (whether annealed or not). The adhesion of Ag—Ni—Ag to the GaN p-type material is sufficient to withstand further processing. When processed in accordance with the disclosed process, the thin Ni layer serves to control Ag grain growth and further serves to induce low contact resistance when a certain minimum amount of oxygen is present in this layer. Further, the Ag—Ni—Ag stack may be patterned by lift off or etching.

FIG. 1 is a diagram of a series of semiconductor layers 100 used to form a device, the device including a stack of metals configured as an electrical contact that has been formed by controlling oxygen concentration levels during processing (e.g., annealing) of highly-reflective contacts. The layers comprise a portion of an LED 104, and include an n-type later 114, active region 112, and a p-type layer 110, over which is formed a highly conductive contact. The highly conductive contact is formed of a sandwich or stack of metals (e.g., contact 102), in this case, a stack comprising a layer of silver 106 atop which is a layer of nickel 108 atop which is another layer of silver 106. In the specific embodiment shown, the silver layers are about 1000 Å thick, and the nickel layer is about 5 Å to 20 Å thick. In some embodiments, the LED growth substrate 115 may include $Al_2O_3$, SiC, Si, or GaN etc. These substrates may be thinned or removed during the processing of the LED. An electrical measurement can be performed on the device to ascertain the effectiveness and stability of the oxygen dose (e.g., to measure resistivity of the contact).

Figure 2:
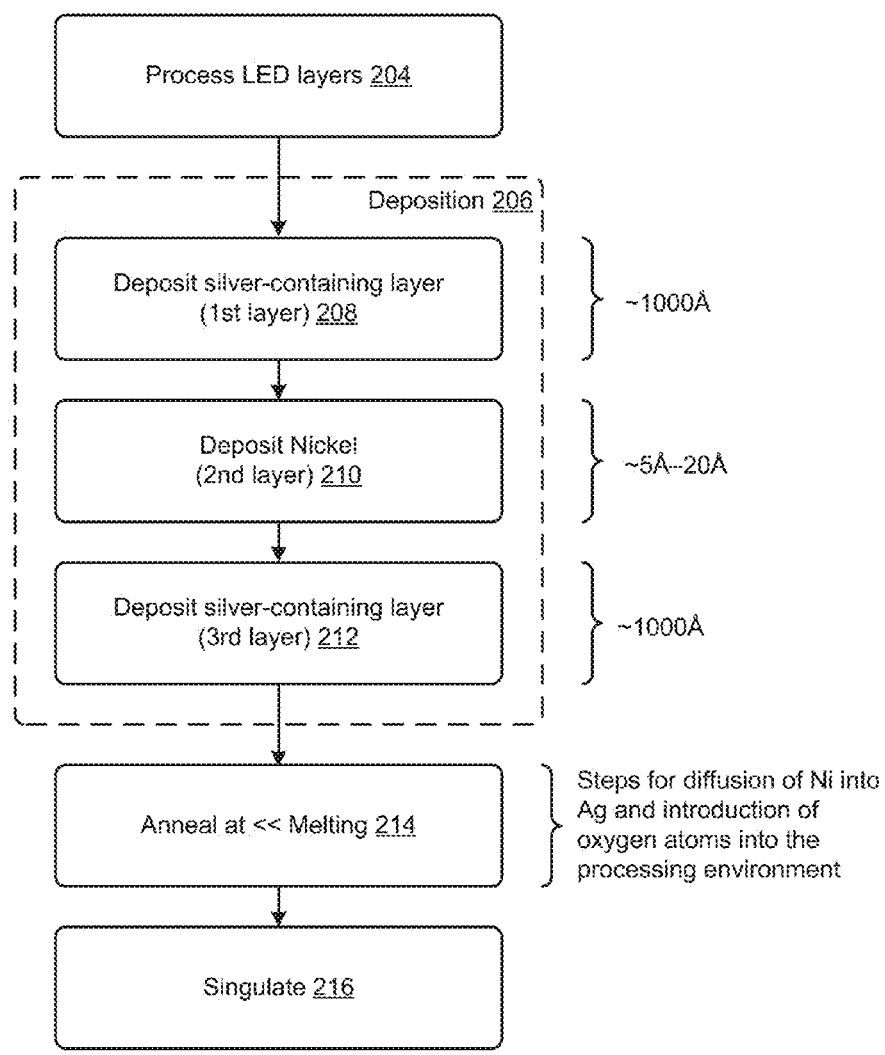
FIG. 2 depicts a portion of a process flow for forming an LED device by controlling oxygen concentration levels during annealing of highly-reflective contacts, according to some embodiments.

FIG. 2 depicts a portion of a process flow 200 for forming an LED device by controlling oxygen concentration levels during annealing of highly-reflective contacts. Shown is a chart, including several steps performed during the formation of an LED on a wafer (see step 204). Atop of the substrate (e.g., substrate of Al, 2O$_3$, SiC, Si, etc.) an n-type layer is formed. The n-type layer is formed of a semiconducting material (e.g., GaN, doped with Si or O) followed by formation of an epitaxially-grown active region (e.g., using InGaN), atop of which is formed a p-type layer (e.g., GaN doped with Mg) to form the LED. In the deposition steps (see deposition 206), the three layers of contact 102 are formed using a deposition chamber. As shown, the deposition includes depositing a silver layer (see step 208), depositing a nickel (see step 210), and depositing another silver layer (see step 212). The deposited metals are annealed at a temperature less than the melting point of the deposited metals where oxygen is controlled (see step 214). In exemplary cases, the annealing causes diffusion of the nickel into the silver, which in turn can blur the transitions from silver to nickel and from nickel to silver so that the nickel layer might appear (e.g., in a SIMS scan) as thinner than the aforementioned 5A to 20A. The Ni—Ag interfaces may or may not exhibit sharp transition regions. After additional processing steps, the LEDs on the wafers are singulated (see step 216) to produce individual devices such as is depicted in the device of FIG. 1.

Controlling the atmosphere within the annealing chamber is facilitated by using fill tubes and evacuation tubes, as are shown and discussed as pertains to FIG. 3A.

FIG. 3A depicts an annealing apparatus 3A00 fitted with fill tubes for forming an LED device by controlling oxygen concentration levels during annealing of highly-reflective contacts.

As shown in FIG. 3A, the annealing capsule 302 has many interfaces to the ambient environment (e.g., $N_2$ fill-tube 308, $O_2$ fill-tube 309, evacuation tube 306). Some apparatus for annealing (e.g., furnace, capsule) have tendencies to leak oxygen into the annealing capsule (e.g., through a seam or seams), and the leaked oxygen comes in contact with the surfaces of the wafers 304. Some wafers that are processed in an apparatus such as depicted in FIG. 3A exhibit good contacts only around the outer edges of the wafer (e.g., see high conductivity contacts 314 of FIG. 3B). Contacts formed nearer to the center of the wafer (e.g., in the large inner region 310) exhibit bad contact characteristics (e.g., see low conductivity contacts 312 of FIG. 3B). SIMS scans performed on selected contacts (e.g., both selected from the outer periphery and from selected locations nearer to the center of the wafer) exhibit measurable differences as comparing good and bad contacts. In particular, contacts from devices formed in the small outer region 320 show a higher oxygen concentration in the Ni layer as compared to contacts formed nearer to the center of the wafer. Contacts from devices formed in the small outer region 320 are measured to be highly-conductive (good contacts).

FIG. 3B depicts a wafer showing device characterization variations 3B00 after experiments for controlling oxygen concentration levels during annealing of highly-reflective contacts. The face of a wafer is divided into two regions. A first region (see small outer region 320) comprises devices that statistically more often exhibit the desired characteristics of high electrical conductivity as well as high reflectivity (e.g., without significant tarnishing). A second region (see large inner region 310) comprises devices that statistically more often exhibit the undesirable characteristics of low electrical conductivity. This observation motivated experimentation to identify the cause of the performance variation between the devices taken from the inner region as compared with the performance of devices taken from the outer region. Observations correlated to the concentration of oxygen in the chamber during the deposition processes. In one set of experiments, substantially all of the oxygen in the chamber was evacuated and the conductivity of the contacts was measured and was found to be low. In another set of experiments, a small, controlled amount of oxygen was flowed into the chamber during annealing, and the conductivity of the contacts was measured and was found to be high. Further experiments showed the measured conductivity over a range from very low oxygen concentrations to much higher concentrations. Results of the foregoing experiments (e.g., characterization of the resulting devices) are plotted in the diagrams of FIG. 4A, FIG. 4B, FIG. 4C and FIG. 4D.

FIG. 4A depicts characterization variation regimes 4A00 that emerge after experiments for controlling oxygen concentration levels during annealing of highly-reflective contacts.

FIG. 4A depicts four regimes 402 of contact characteristics that are correlated to varying concentrations of oxygen. In the leftmost "low conductivity regime" the contacts exhibit low conductivity 404. As the concentration of oxygen is increased, the contacts begin to exhibit progressively higher to high conductivity 406 throughout the desired "mid-range concentration regime". As the oxygen concentration goes still higher, the contacts formed in such relatively high oxygen concentrations begins to exhibit again a lower conductivity 408. At still higher oxygen concentrations, the presence of oxygen during the annealing processes introduces tarnishing of the metals (e.g., silver oxidation 410), which is undesirable for reflectivity.

FIG. 4B and FIG. 4C depict variations in resistivity 412 as oxygen concentration is increased (see FIG. 4B), and variations in reflectivity 414 as oxygen concentration is increased (see FIG. 4C). The variations of resistivity and reflectivity are superimposed in FIG. 4D. The variations of resistivity and reflectivity are now briefly discussed.

FIG. 4B depicts electrical resistivity variations 4B00 that emerge after characterization of devices formed by varying the conditions and techniques for controlling oxygen concentration levels during annealing of highly-reflective contacts.

FIG. 4C depicts reflectivity variations 4C00 that emerge after characterization of devices formed by varying the conditions and techniques for controlling oxygen concentration levels during annealing of highly-reflective contacts.

FIG. 4D depicts a chart 4D00 showing device efficiency, which is a function of resistivity variations and reflectivity variations. The resistivity variation curve is plotted over a reflectivity variation curve, and further, a device efficiency curve 413 is superimposed over the resistivity variation and reflectivity variation curves.

Figure 5A:
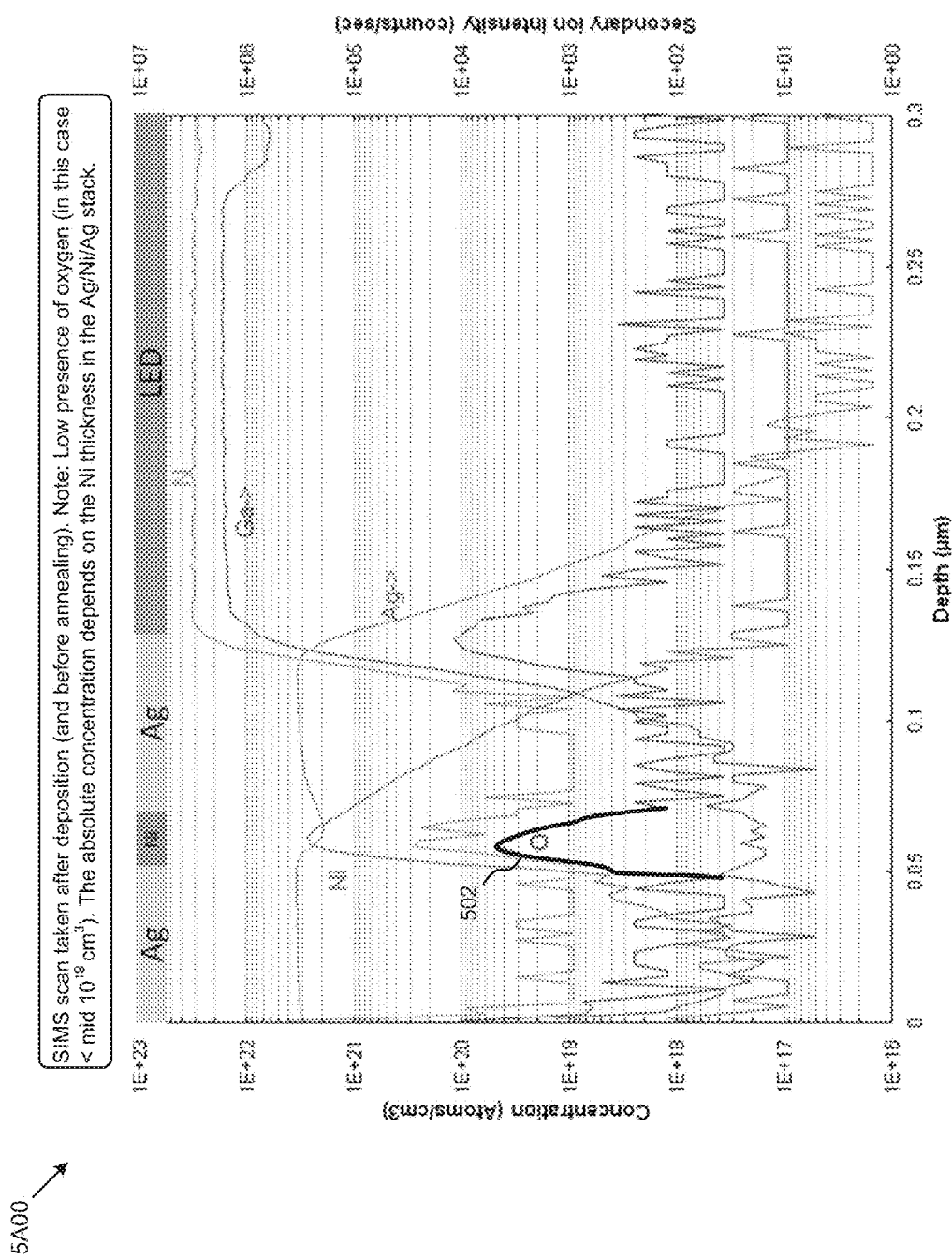
FIG. 5A is a secondary ion mass spectroscopy (SIMS) analysis of a contact before annealing.

FIG. 5A is a secondary ion mass spectroscopy (SIMS) analysis 5A00 of a contact before annealing. The shown SIMS scan is taken after deposition (and before annealing). This depicts bad (e.g., poorly conducting) contact. Little oxygen is present. As shown, the oxygen concentration 502 is less than about $5 \times 10^{19}$ $cm^{-3}$). The absolute concentration depends, at least in part, on the Ni thickness in the Ag/Ni/Ag stack. It is visible that the Ni atoms have not diffused to the semiconductor-metal interface.

Figure 5B:
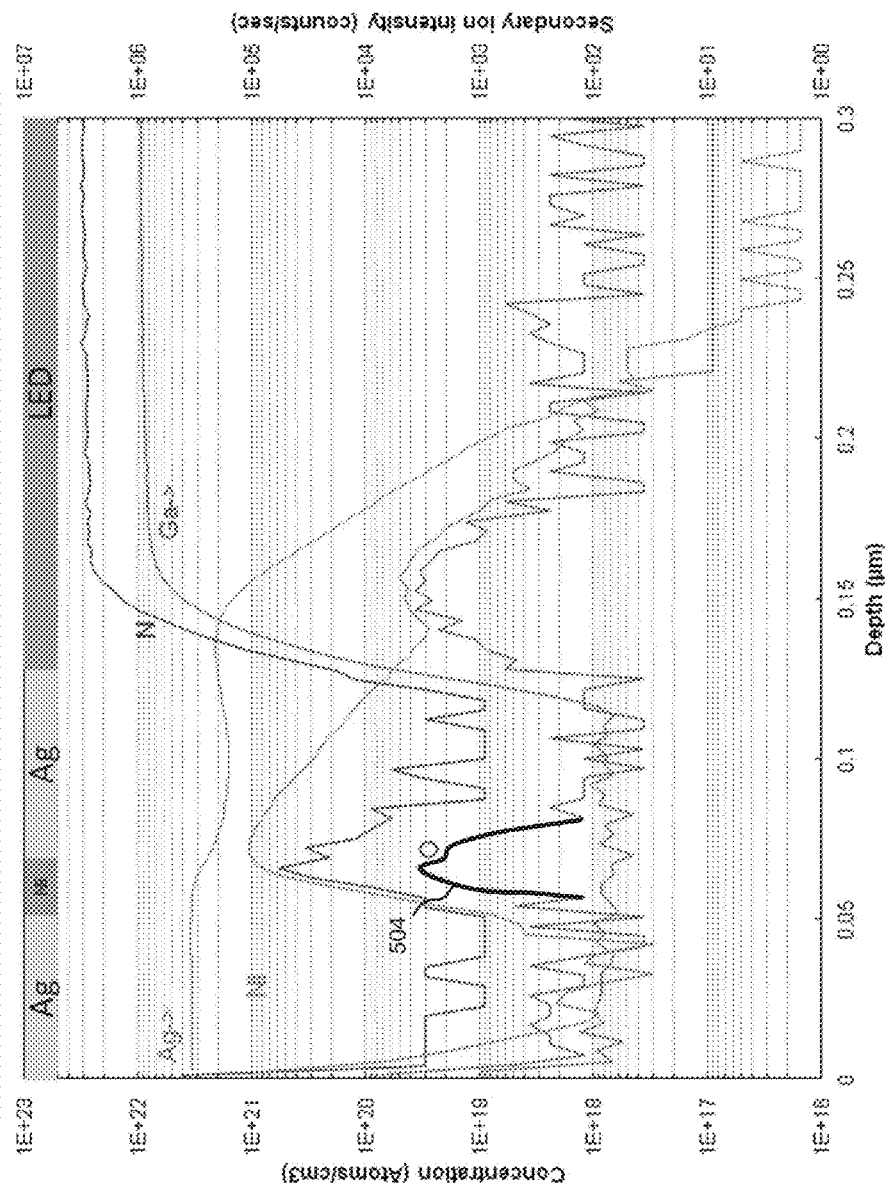
FIG. 5B is a SIMS scan of a contact after annealing in an oxygen-rarified environment.

FIG. 5B is a SIMS scan 5B00 of a contact after annealing in an oxygen-rarified environment. The shown SIMS is taken after anneal when not enough oxygen is provided during the anneal step (the oxygen in the Ni layer is similar to as deposited, such as is shown in FIG. 5A). In this case the rarified oxygen concentration 504, expressed in atoms per volume is less than about $5 \times 10^{19}$ $cm^{-3}$. It is visible that Ni atoms have diffused through the Ag to the semiconductor-metal interface. This is a poorly conducting contact.

FIG. 5C is a SIMS scan 5C00 of a contact after annealing in an environment where the oxygen concentration is controlled to provide enough oxygen during the anneal step. As shown, the Ni layer oxygen concentration 505 is greatly increased as compared to oxygen in the Ni layer as of the time it was deposited. In the case as shown in the SIMS scan 5C00, the oxygen concentration (in atoms per volume) is in the mid $10^{20}$ $cm^{-3}$ (from about $1 \times 10^{20}$ $cm^{-3}$ to about $7 \times 10^{20}$ $cm^{-3}$). The absolute concentration may depend on the Ni thickness. This SIMS scan depicts a good (e.g., highly conducting) contact. It is visible that Ni atoms have diffused to the metal-semiconductor interface.

Figure 6A:
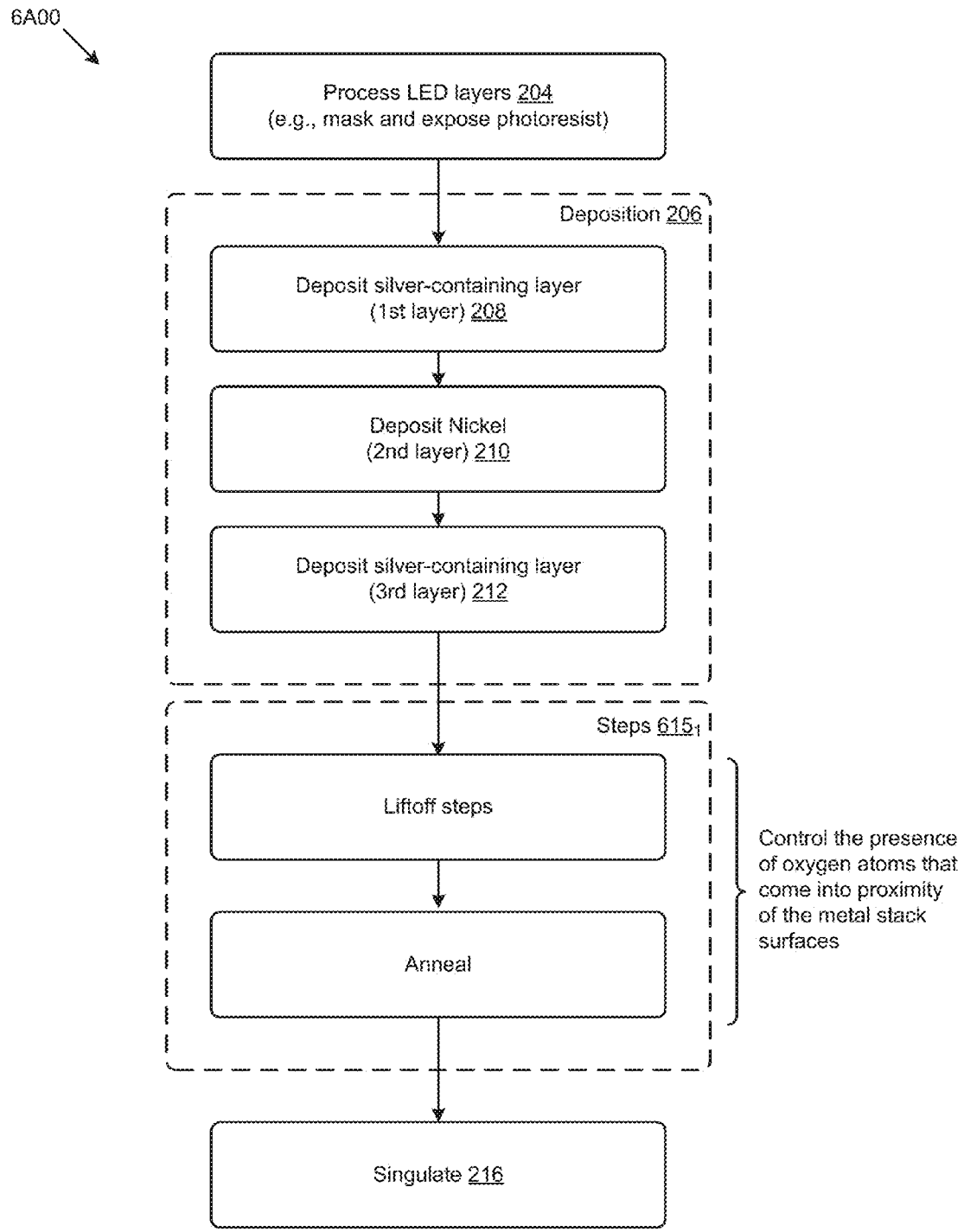
FIG. 6A exemplifies a process flow for controlling oxygen concentration levels during processing steps to form highly-reflective contacts, according to some embodiments.

FIG. 6A exemplifies a process flow 6A00 for controlling oxygen concentration levels during processing steps to form highly-reflective contacts. As shown, the processing flow includes steps for liftoff and annealing (see steps $615_1$). The conditions under which the liftoff and annealing steps are performed serve, either singly or in combination, to control the oxygen atom concentrations that remain in the layers of the resulting contacts.

Figure 6B:
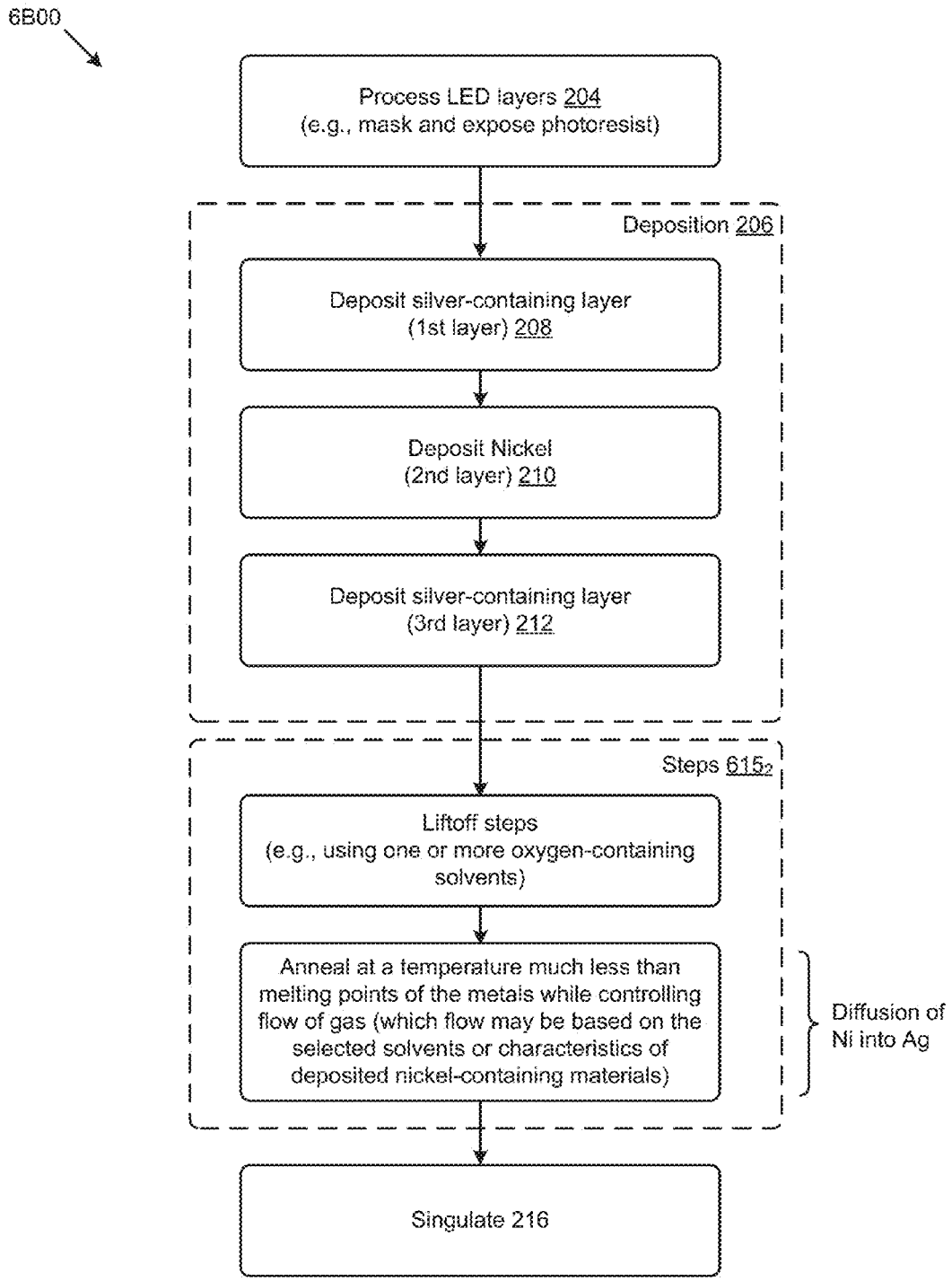
FIG. 6B exemplifies a process flow for controlling oxygen concentration levels during processing steps to form highly-reflective contacts, according to some embodiments.

FIG. 6B exemplifies a process flow 6B00 for controlling oxygen concentration levels during processing steps to form highly-reflective contacts. As shown, the processing flow includes liftoff and annealing steps $615_2$ that serve, either singly or in combination, to control the oxygen concentration levels during processing. As shown, the liftoff steps use oxygen-containing solvents. During annealing, Ni is diffused into Ag while the presence of oxygen in the annealing environment is controlled.

Figure 6C:
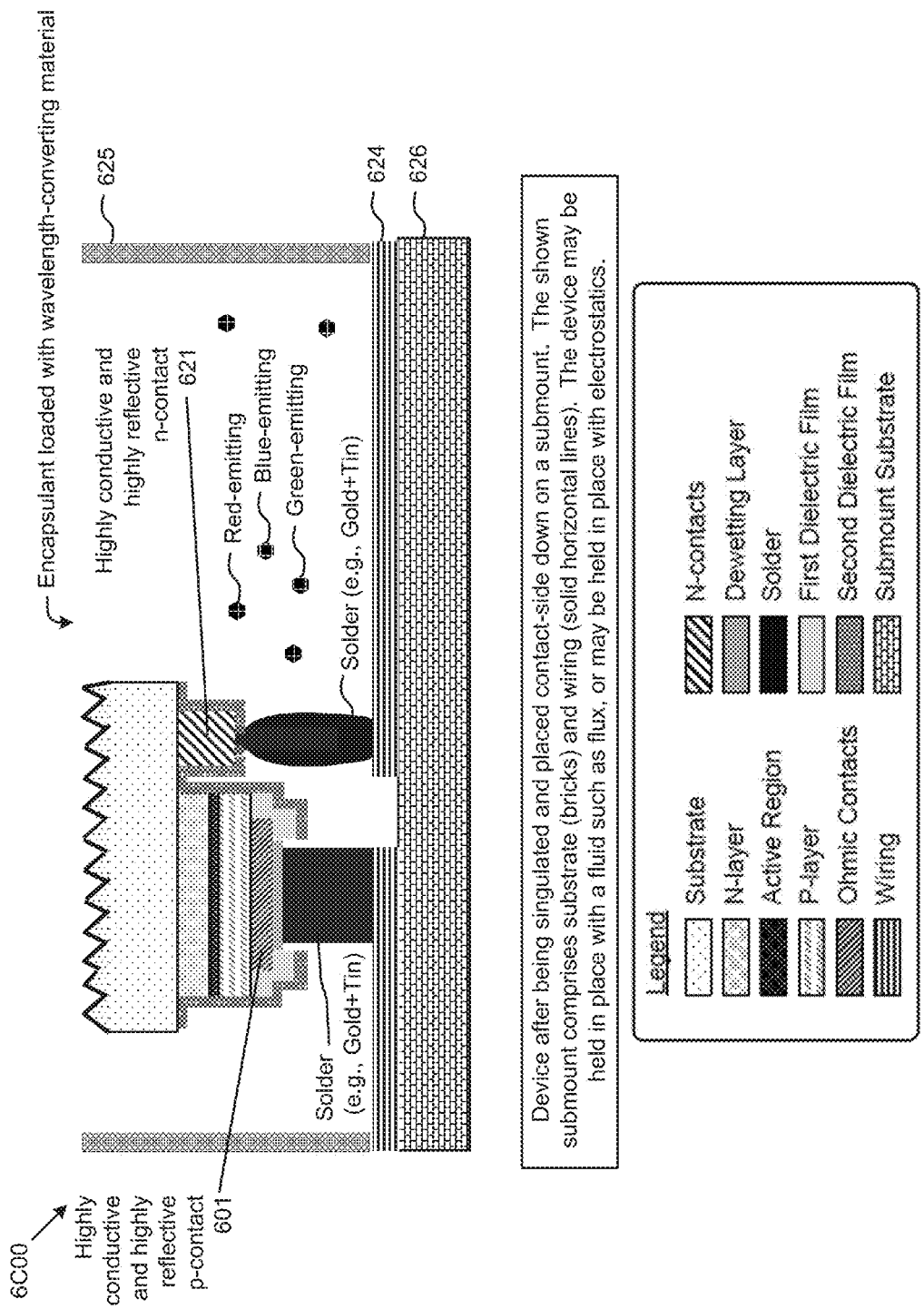
FIG. 6C shows a flip-chip device having highly-conductive- and highly-reflective contacts, according to some embodiments.

FIG. 6C shows a flip-chip device 6C00 having a highly-conductive and highly-reflective n-contact 621. More specifically, the shown device depicts an epitaxially-formed LED atop a submount formed of a substrate 626 and wiring 624. Solder serves to electrically connect the highly conductive and highly reflective contact 601 to wiring 624.

As shown, the die is encapsulated. The encapsulant 625 can be loaded with wavelength-converting materials (e.g., red-emitting phosphor, blue-emitting phosphor, green-emitting phosphor, etc.). In some cases the encapsulant is also loaded with thermally-conductive materials, which may be index matched. Related techniques are disclosed in U.S. application Ser. No. 14/097,481, filed on Dec. 5, 2013, each of which is incorporated by reference in its entirety.

Given the aforementioned discoveries, an apparatus can be designed so as to precisely control the amount of oxygen in the annealing furnace so as to achieve the desired oxygen concentration (e.g., in the mid-range concentration regime). For example, an annealing furnace can be configured to have a flow tube into which a gas (e.g., oxygen, nitrogen) or a mixture of gasses can be introduced. In order to evacuate the chamber of oxygen, another purge gas (e.g., nitrogen gas) can be flowed for a duration. Certain annealing steps are carried out in the oxygen free atmosphere within the chamber. Other annealing steps can be carried out in the presence of a precisely-controlled concentration of oxygen. Such control can be enabled by controlling the pressure and duration of the introduction of oxygen into the flow tube.

The aforementioned apparatus is but one possible embodiment. Other apparatus include vacuum furnaces where the entire annealing chamber is evacuated of gas (e.g., using a vacuum pump). Oxygen and/or nitrogen may be introduced at any time to control the oxygen present in the oxygen gettering layer, according to the herein disclosed techniques.

In various situations, controlling oxygen concentration levels when forming highly-reflective and electrically conductive contacts of an optoelectronic semiconductor device can include: (1) depositing a metallic stack on a semiconductor plane of the optoelectronic semiconductor device (e.g., where the stack comprises a silver layer and an oxygen-gettering metal); and/or (2) introducing a dose of oxygen into the metallic stack at a varying rate of flow (and/or varying the rate of flow of nitrogen); and/or (3) annealing the optoelectronic semiconductor device to diffuse an oxygen-gettering metal into the interfaces between a semiconductor layer and the metallic stack.

The use of the foregoing apparatus and methods results in LEDs that exhibit the following characteristics:

A highly conductive Ag-based contact processed according to the disclosed techniques can have a contact resistance of $5\times10^{-4}$ Ohm-cm$^2$ or lower as can be measured by a transmission line measurement (TLM).

The highly conductive Ag-based contacts processed according to the disclosed techniques are also highly reflective, as can be measured by reflectance measurements. The measured reflectivity of the Ag-based contact is at least as high as the reflectivity of Ag described in *Handbook of Optical Constants of Solids* by Edward D. Palik (1985).

Due to the high reflectivity and the high conductivity of the Ag-based contact processed according to the disclosed techniques, the LED made with such a contact may be operated with a high wall plug efficiency of at least 50% at 200 Å/cm$^2$ and 130° C.

The adhesion of a Ag-based contact to GaN allows for reliable processing and reliable operation of the LED.

The metal stack forming the contact contains oxygen in an elevated concentration. For example, the nickel layer contains an elevated oxygen concentration level.

The contact can be measured to show a higher oxygen concentration than was present after deposition and before annealing where the oxygen-gettering material (such as Nickel) is present. For example, the higher oxygen concentration can be in the range of $5\times10^{19}$ cm$^{-3}$ or higher atoms per cubic centimeter.

The oxygen-gettering material (such as Nickel) has diffused to the metal-semiconductor interface.

For subsequent metal layers, it was found that platinum (Pt) should not be in contact with Ag if the LED chip goes through a high temperature process (T>300° C.) as the high temperature process degrades both the electrical and optical properties of the contact. Thus if subsequent layers are deposited, an acceptable metal scheme may be Ti—Pt—Au—Pt (1000 Å-1000 Å-5000 Å-1200 Å). Strictly as an example, one possible metal scheme was shown to allow for good protection of the Ag contact as well as a good contact to the AuSn die attach process.

LED devices made in accordance with the foregoing can be used in illumination devices such as lamps such as MR-16 lamps. The aforementioned MR-16 lamp is merely one embodiment of a lamp that conforms to fit with any one or more of a set of mechanical and electrical standards. Table 1 gives standards (see "Designation") and corresponding characteristics.

TABLE 1

| Designation | Base Diameter (Crest of thread) | Name | IEC 60061-1 standard sheet |
|---|---|---|---|
| E05 | 05 mm | Lilliput Edison Screw (LES) | 7004-25 |
| E10 | 10 mm | Miniature Edison Screw (MES) | 7004-22 |
| E11 | 11 mm | Mini-Candelabra Edison Screw (mini-can) | (7004-06-1) |
| E12 | 12 mm | Candelabra Edison Screw (CES) | 7004-28 |
| E14 | 14 mm | Small Edison Screw (SES) | 7004-23 |
| E17 | 17 mm | Intermediate Edison Screw (IES) | 7004-26 |
| E26 | 26 mm | [Medium](one-inch) Edison Screw (ES or MES) | 7004-21A-2 |
| E27 | 27 mm | [Medium] Edison Screw (ES) | 7004-21 |
| E29 | 29 mm | [Admedium] Edison Screw (ES) | |
| E39 | 39 mm | Single-contact (Mogul) Giant Edison Screw (GES) | 7004-24-A1 |
| E40 | 40 mm | (Mogul) Giant Edison Screw (GES) | 7004-24 |

Additionally, the base member of a lamp can be of any form factor configured to support electrical connections, which electrical connections can conform to any of a set of types or standards. For example, Table 2 gives standards (see "Type") and corresponding characteristics, including mechanical spacing between a first pin (e.g., a power pin) and a second pin (e.g., a ground pin).

TABLE 2

| Type | Standard | Pin center to center | Pin Diameter | Usage |
|---|---|---|---|---|
| G4 | IEC 60061-1 (7004-72) | 4.0 mm | 0.65-0.75 mm | MR11 and other small halogens of 5/10/20 watt and |

TABLE 2-continued

| Type | Standard | Pin center to center | Pin Diameter | Usage |
|---|---|---|---|---|
| GU4 | IEC 60061-1 (7004-108) | 4.0 mm | 0.95-1.05 mm | 6/12 volt |
| GY4 | IEC 60061-1 (7004-72A) | 4.0 mm | 0.65-0.75 mm | |
| GZ4 | IEC 60061-1 (7004-64) | 4.0 mm | 0.95-1.05 mm | |
| G5 | IEC 60061-1 (7004-52-5) | 5 mm | | T4 and T5 fluorescent tubes |
| G5.3 | IEC 60061-1 (7004-73) | 5.33 mm | 1.47-1.65 mm | |
| G5.3-4.8 | IEC 60061-1 (7004-126-1) | | | |
| GU5.3 | IEC 60061-1 (7004-109) | 5.33 mm | 1.45-1.6 mm | |
| GX5.3 | IEC 60061-1 (7004-73A) | 5.33 mm | 1.45-1.6 mm | MR16 and other small halogens of 20/35/50 watt and 12/24 volt |
| GY5.3 | IEC 60061-1 (7004-73B) | 5.33 mm | | |
| G6.35 | IEC 60061-1 (7004-59) | 6.35 mm | 0.95-1.05 mm | |
| GX6.35 | IEC 60061-1 (7004-59) | 6.35 mm | 0.95-1.05 mm | |
| GY6.35 | IEC 60061-1 (7004-59) | 6.35 mm | 1.2-1.3 mm | Halogen 100 W 120 V |
| GZ6.35 | IEC 60061-1 (7004-59A) | 6.35 mm | 0.95-1.05 mm | |
| G8 | | 8.0 mm | | Halogen 100 W 120 V |
| GY8.6 | | 8.6 mm | | Halogen 100 W 120 V |
| G9 | IEC 60061-1 (7004-129) | 9.0 mm | | Halogen 120 V (US)/230 V (EU) |
| G9.5 | | 9.5 mm | 3.10-3.25 mm | Common for theatre use, several variants |
| GU10 | | 10 mm | | Twist-lock 120/230-volt MR16 halogen lighting of 35/50 watt, since mid-2000s |
| G12 | | 12.0 mm | 2.35 mm | Used in theatre and single-end metal halide lamps |
| G13 | | 12.7 mm | | T8 and T12 fluorescent tubes |
| G23 | | 23 mm | 2 mm | |
| GU24 | | 24 mm | | Twist-lock for self-ballasted compact fluorescents, since 2000s |
| G38 | | 38 mm | | Mostly used for high-wattage theatre lamps |
| GX53 | | 53 mm | | Twist-lock for puck-shaped under-cabinet compact fluorescents, since 2000s |

The list above is representative and should not be taken to include all the standards or form factors that may be used within embodiments described herein.

FIG. 7A through FIG. 7I depict embodiments of the present disclosure in the form of lamp applications. In these lamp applications, one or more light-emitting diodes are used in lamps and fixtures. Such lamps and fixtures include replacement and/or retro-fit directional lighting fixtures.

Figure 7A:
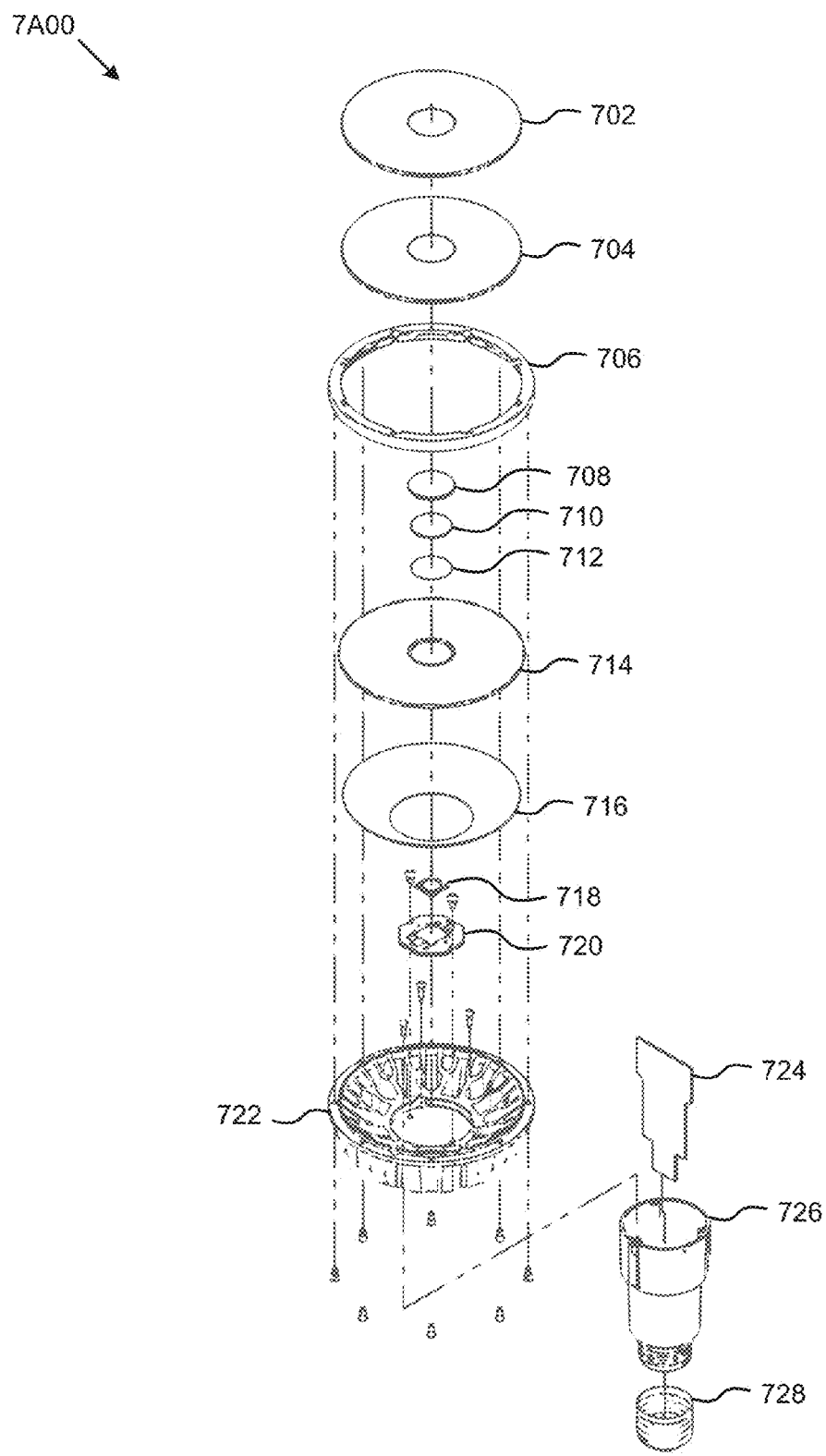
Figure 7G:
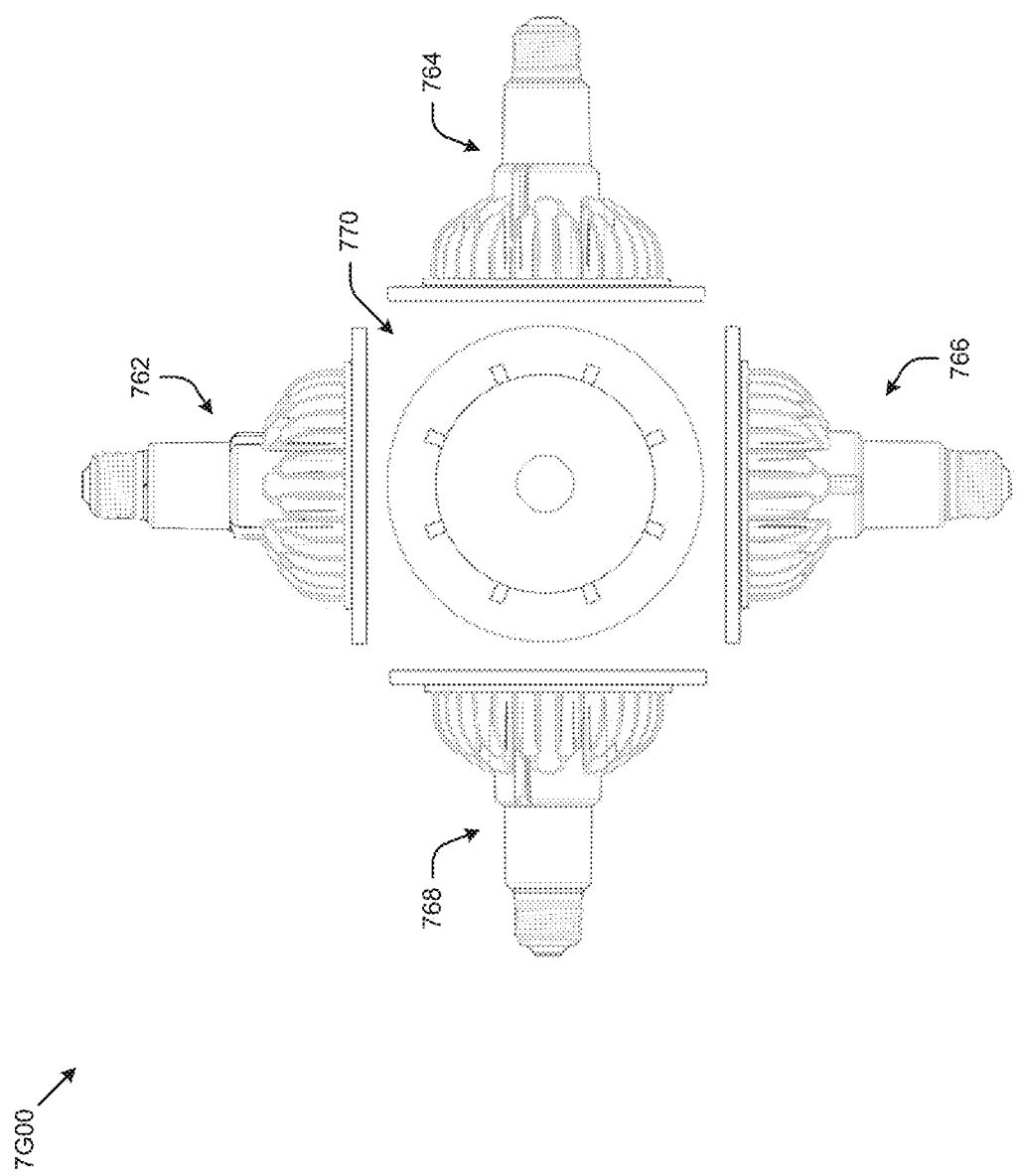

In some embodiments, aspects of the present disclosure can be used in an assembly. As shown in FIG. 7A, an assembly can comprise:
a screw cap 728
a driver housing 726
a driver board 724
a heat sink 722
a metal-core printed circuit board 720
an LED lightsource 718
a dust shield 716
a lens 714
a reflector disc 712
a magnet 710
a magnet cap 708
a trim ring 706
a first accessory 704
a second accessory 702

The components of assembly 7A00 may be described in substantial detail. Some components are 'active components' and some are 'passive' components, and can be variously-described based on the particular component's impact to the overall design, and/or impact(s) to the objective optimization function. A component can be described using a CAD/CAM drawing or model, and the CAD/CAM model can be analyzed so as to extract figures of merit as may pertain to e particular component's impact to the overall design, and/or impact(s) to the objective optimization function. Strictly as one example, a CAD/CAM model of a trim ring is provided in a model corresponding to the drawing of FIG. 7A2.

The components of the assembly 7A00 can be fitted together to form a lamp. FIG. 7B depicts a perspective view 730 and top view 732 of such a lamp. As shown in FIG. 7B, the lamp 7B00 comports to a form factor known as PAR30L. The PAR30L form factor is further depicted by the principal views (e.g., left 740, right 736, back 734, front 738 and top 742) given in array 7C00 of FIG. 7C.

The components of the assembly 7A00 can be fitted together to form a lamp. FIG. 7D depicts a perspective view 744 and top view 746 of such a lamp. As shown in FIG. 7D, the lamp 7D00 comports to a form factor known as PAR30S. The PAR30S form factor is further depicted by the principal views (e.g., left 754, right 750, back 748, front 752 and top 756) given in array 7E00 of FIG. 7E.

The components of the assembly 7A00 can be fitted together to form a lamp. FIG. 7F depicts a perspective view 758 and top view 760 of such a lamp. As shown in FIG. 7F, the lamp 7F00 comports to a form factor known as PAR38. The PAR38 form factor is further depicted by the principal views (e.g., left 768, right 764, back 762, front 766 and top 770) given in array 7G00 of FIG. 7G.

The components of the assembly 7A00 can be fitted together to form a lamp. FIG. 7H depicts a perspective view 772 and top view 774 of such a lamp. As shown in FIG. 7H, the lamp 7H00 comports to a form factor known as PAR111. The PAR111 form factor is further depicted by the principal views (e.g., left 782, right 778, back 776, front 780 and top 784) given in array 7I00 of FIG. 7I.

FIG. 8A through FIG. 8I depict embodiments of the present disclosure as can be applied toward lighting applications. In these embodiments, one or more light-emitting diodes 8A10, as taught by this disclosure, can be mounted on a submount or package to provide an electrical interconnection. The submount or package can be a ceramic, oxide, nitride, semiconductor, metal, or combination thereof that includes an electrical interconnection capability 8A20 for the various LEDs. The submount or package can be mounted to a heatsink member 8B50 via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing.

The total light emitting surface (LES) of the LEDs and any down-conversion materials can form a light source 8A30. One or more light sources can be interconnected into an array 8B20, which in turn is in electrical contact with connectors 8B10 and brought into an assembly 8B30. One or more lens elements 8B40 can be optically coupled to the light source. The lens design and properties can be selected so that the desired directional beam pattern for a lighting product is achieved for a given LES. The directional lighting product may be an LED module, a retrofit lamp 8B70, or a lighting fixture 8C30. In the case of a retrofit lamp, an electronic driver can be provided with a surrounding member 8B60, the driver to condition electrical power from an external source to render it suitable for the LED light source. The driver can be integrated into the retrofit lamp. In the case of a fixture, an electronic driver is provided which conditions electrical power from an external source to make it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of suitable external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based MR16, PAR16, PAR20, PAR30, PAR38, BR30, A19 and various other lamp types. Examples of fixtures include replacements for halogen-based and ceramic metal halide-based directional lighting fixtures.

Figure 8A:
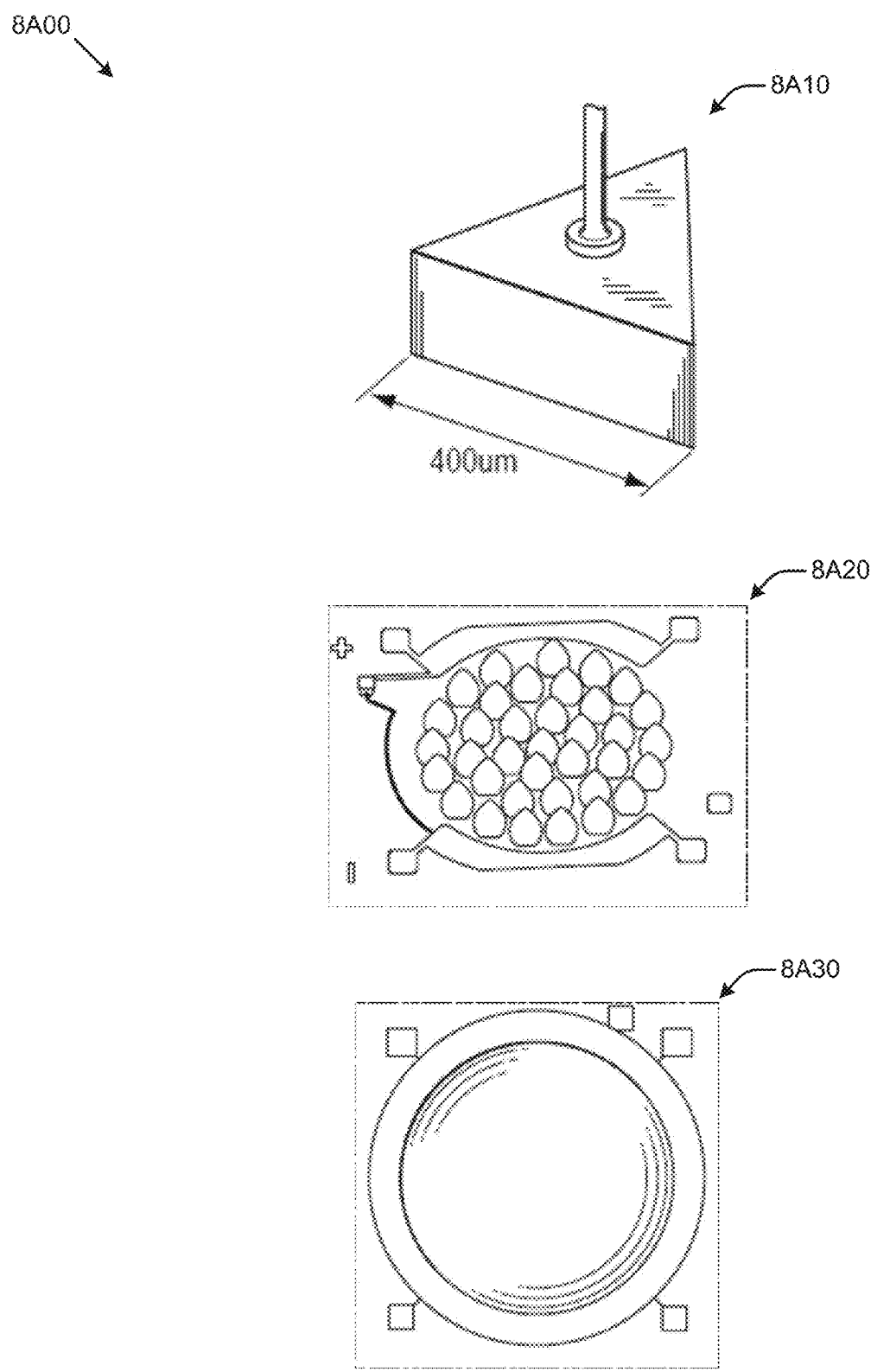
Figure 8B:
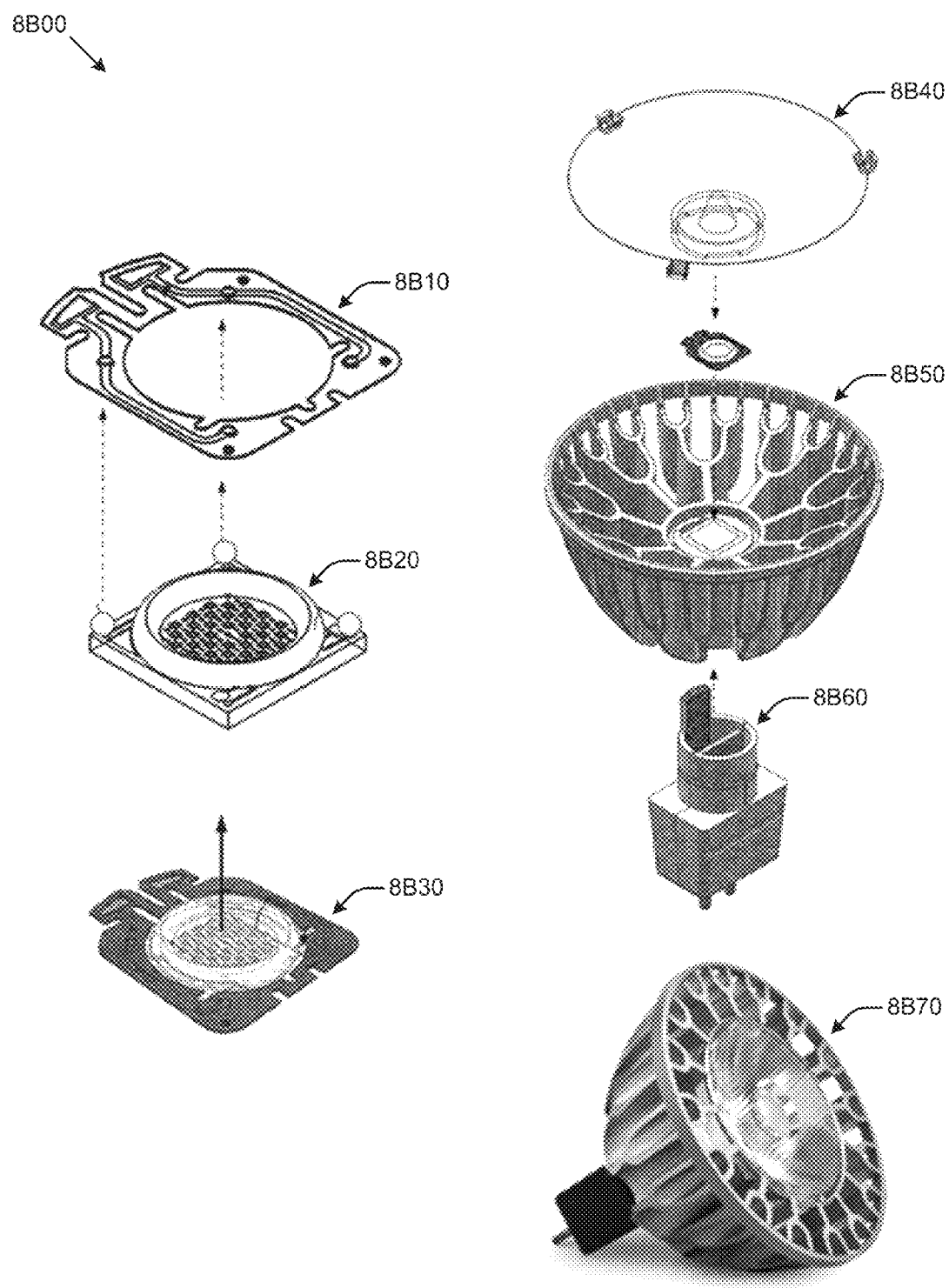
Figure 8C:
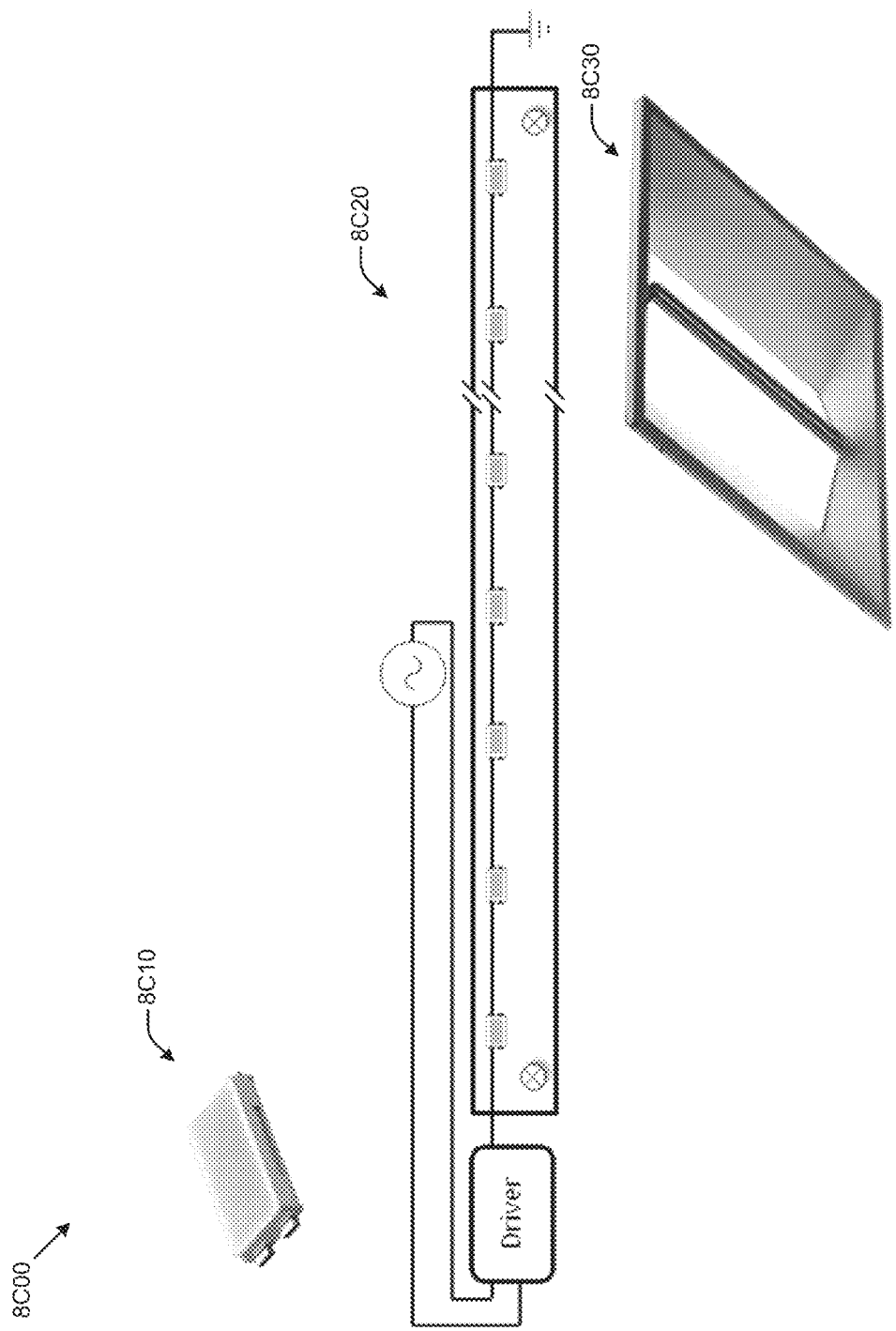

In some embodiments, the present disclosure can be applied to non-directional lighting applications. In these embodiments, one or more light-emitting diodes (LEDs), as taught by the disclosure, can be mounted on a submount or package to provide an electrical interconnection. The submount or package can be, for example, a ceramic, oxide, nitride, semiconductor, metal, or combination of any of the foregoing that includes electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination thereof. The LEDs can be distributed to provide a desired shape of the light source. For example, one common shape is a linear light source for replacement of conventional fluorescent linear tube lamps. One or more optical elements can be coupled to the LEDs to provide a desired non-directional light distribution. The non-directional lighting product may be an LED module, a retrofit lamp, or a lighting fixture. In the case of a retrofit lamp, an electronic driver can be provided to condition electrical power from an external source to render it suitable for the LED light source, with the driver integrated into the retrofit lamp. In the case of a fixture, an electronic driver is provided to condition electrical power from an external source to render it suitable for the LED light source, with the driver either integrated into the fixture or provided externally to the fixture. In the case of a module, an electronic driver can be provided to condition electrical power from an external source to render it suitable for the LED light source, with the driver either integrated into the module or provided externally to the module. Examples of external power sources include mains AC (e.g., 120 Vrms AC or 240 Vrms AC), low-voltage AC (e.g., 12 VAC), and low-voltage DC (e.g., 12 VDC). In the case of retrofit lamps, the entire lighting product may be designed to fit standard form factors (e.g., ANSI form factors). Examples of retrofit lamp products include LED-based replacements for various linear, circular, or curved fluorescent lamps. An example of a non-directional lighting product is shown in FIG. 8C. Such a lighting fixture can include replacements for fluorescent-based troffer luminaires. In this embodiment, LEDs are mechanically secured into a package 8C10, and multiple packages are arranged into a suitable shape such as linear array 8C20.

Some embodiments of the present disclosure can be applied to backlighting for flat panel display applications. In these embodiments, one or more light-emitting diodes (LEDs), as taught by this disclosure, can be mounted on a submount or package to provide an electrical interconnection. The submount or package can be a ceramic, oxide, nitride, semiconductor, metal, or combination of any of the foregoing that include electrical interconnection capability for the various LEDs. The submount or package can be mounted to a heatsink member via a thermal interface. The LEDs can be configured to produce a desired emission spectrum, either by mixing primary emissions from various LEDs, or by having the LEDs photo-excite wavelength down-conversion materials such as phosphors, semiconductors, or semiconductor nanoparticles ("quantum dots"), or a combination of any of the foregoing. The LEDs can be distributed to provide a desired shape of the light source. One common shape is a linear light source. The light source can be optically coupled to a lightguide for the backlight. This can be achieved by coupling at the edge of the lightguide (edge-lit), or by coupling light from behind the lightguide (direct-lit). The lightguide distributes light uniformly toward a controllable display such as a liquid crystal display (LCD) panel. The display converts the LED light into desired images based on electrical control of light transmission and its color. One way to control the color is by use of filters (e.g., color filter substrate 8D40). Alternatively, multiple LEDs may be used and driven in pulsed mode to sequence the desired primary emission colors (e.g., using a red LED 8D30, a green LED 8D10, and a blue LED 8D20). Optional brightness-enhancing films may be included in the backlight "stack". The brightness-enhancing films narrow the flat panel display emission to increase brightness at the expense of the observer viewing angle. An electronic driver can be provided to condition electrical power from an external source to render it suitable for the LED light source for backlighting, including any color sequencing or brightness variation per LED location (e.g., one-dimensional or two-dimensional dimming). Examples of external power sources include mains AC (e.g., 120 Vrms AC or 240 Vrms AC), low-voltage AC (e.g., 12 VAC), and low-voltage DC (e.g., 12 VDC). Examples of backlighting products are shown in FIG. 8D1, FIG. 8D2, FIG. 8E1 and FIG. 8E2.

Figure 8F:
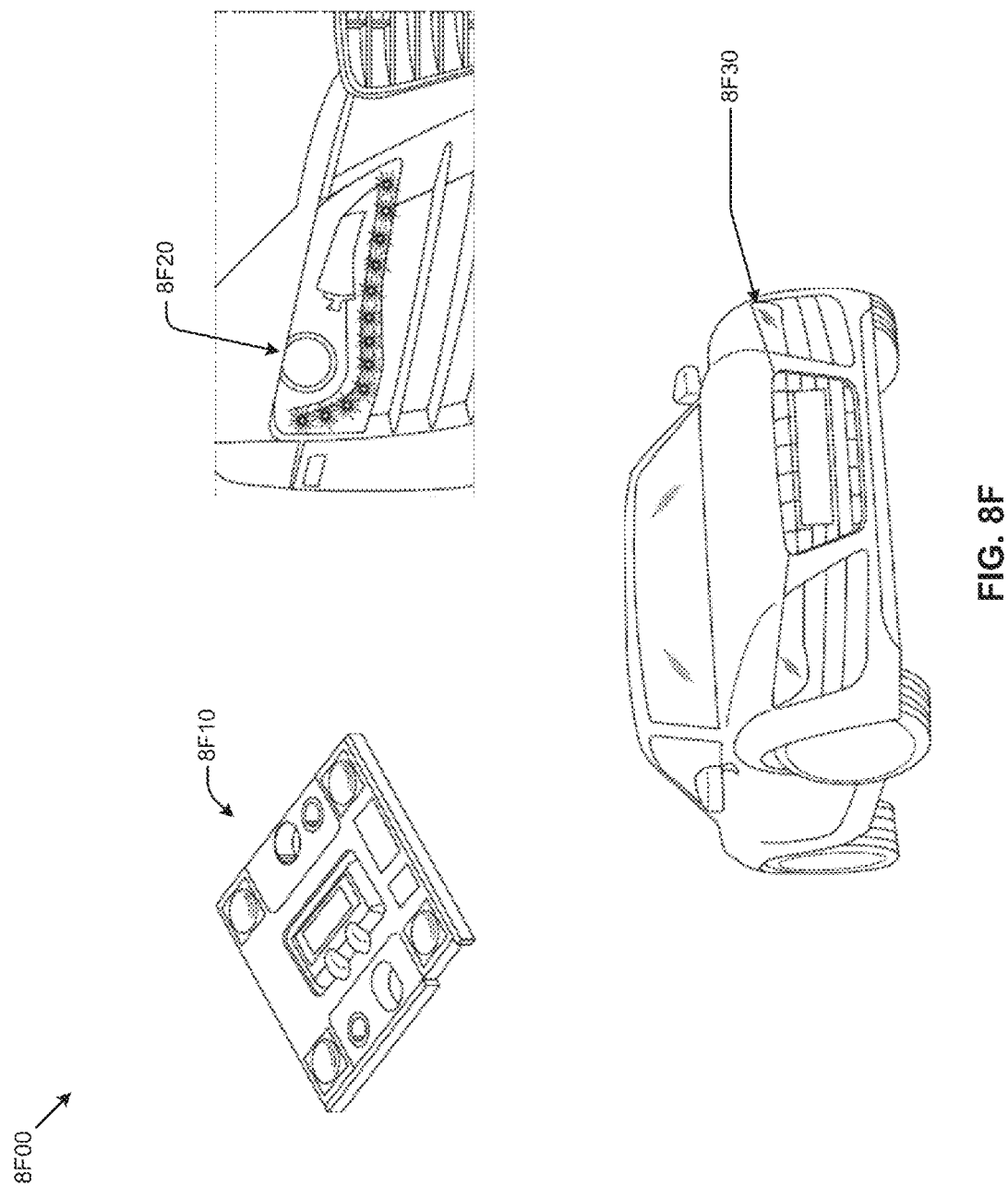

Some embodiments of the present disclosure can be applied to automotive forward lighting applications, as shown in FIG. 8F (e.g., see the example of an automotive forward lighting product 8F30). In these embodiments, one or more light-emitting diodes (LEDs) can be mounted on a submount or on a rigid or semi-rigid package 8F10 to provide an electrical interconnection. The submount or package can be a ceramic, oxide, nitride, semiconductor, metal, or combination thereof, that include electrical interconnection capability for the various LEDs. The submount or package can be mounted to a heatsink member via a thermal interface. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination of any of the foregoing. The total light emitting surface (LES) of the LEDs and any down-conversion materials form a light source. One or more lens elements 8F20 can be optically coupled to the light source. The lens design and properties can be selected to produce a desired directional beam pattern for an automotive forward lighting application for a given LED. An electronic driver can be provided to condition electrical power from an external source to render it suitable for the LED light source. Power sources for automotive applications include low-voltage DC (e.g., 12 VDC). An LED light source may perform a high-beam function, a low-beam function, a side-beam function, or any combination thereof.

In some embodiments the present disclosure can be applied to digital imaging applications such as illumination for mobile phone and digital still cameras (e.g., see FIG. 8G). In these embodiments, one or more light-emitting diodes (LEDs), as taught by the disclosure, can be mounted on a submount or package 8G10 to provide an electrical interconnection. The submount or package can be, for example, a ceramic, oxide, nitride, semiconductor, metal, or combination of any of the foregoing, that include electrical interconnection capability for the various LEDs. The submount or package can be mounted to a circuit board member and fitted with or into a mounting package 8G20. The LEDs can be configured to produce a desired emission spectrum, either by mixing primary emission from various LEDs, or by having the LEDs photo-excite wavelength down-conversion materials such as phosphors, semiconductors, or semiconductor nanoparticles ("quantum dots"), or a combination thereof. The total light emitting surface (LES) of the LEDs and any down-conversion materials form a light source. One or more lens elements can be optically coupled to the light source. The lens design and properties can be selected so that the desired directional beam pattern for an imaging application is achieved for a given LES. An electronic driver can be provided to condition electrical power from an external source to render it suitable for the LED light source. Examples of suitable external power sources for imaging applications include low-voltage DC (e.g., 5 VDC). An LED light source may perform a low-intensity function 8G30, a high-intensity function 8G40, or any combination thereof.

Figure 8H:
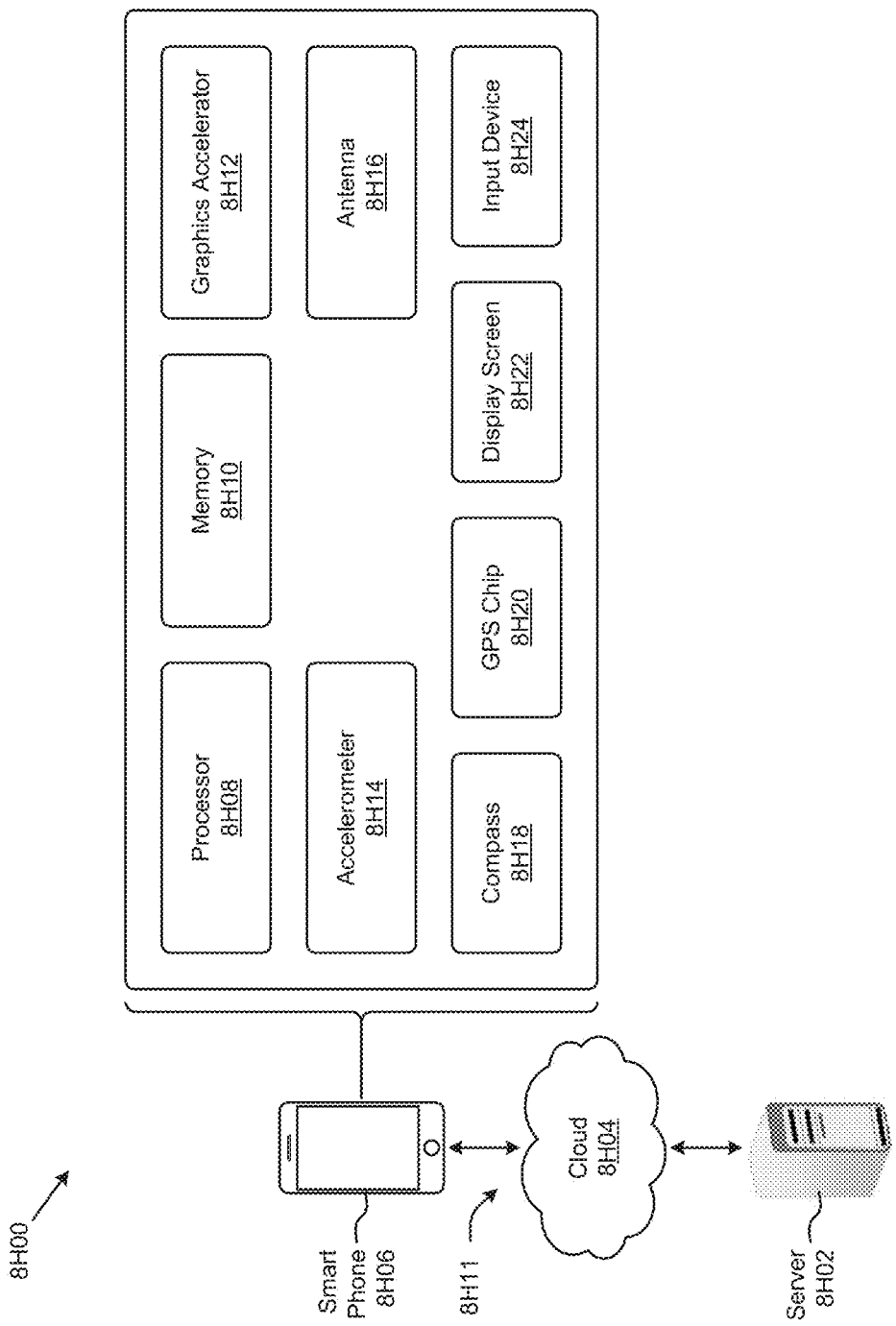

Some embodiments of the present disclosure can be applied to mobile terminal applications. FIG. 8H is a diagram illustrating a mobile terminal (see smart phone architecture 8H00). As shown, the smart phone 8H06 includes a housing, display screen, and interface device, which may include a button, microphone, and/or touch screen. In certain embodiments, a phone has a high resolution camera device, which can be used in various modes. An example of a smart phone can be an iPhone from Apple Inc. of Cupertino, Calif. Alternatively, a smart phone can be a Galaxy from Samsung, or others.

In an example, the smart phone may include one or more of the following features (which are found in an iPhone 4 from Apple Inc., although there can be variations), see www.apple.com:
- GSM model: UMTS/HSDPA/HSUPA (850, 900, 1900, 2100 MHz); GSM/EDGE (850, 900, 1800, 1900 MHz)
- CDMA model: CDMA EV-DO Rev. A (800, 1900 MHz)
- 802.11b/g/n Wi-Fi (802.11n 2.4 GHz only)
- Bluetooth 2.1+EDR wireless technology
- Assisted GPS
- Digital compass
- Wi-Fi
- Cellular
- Retina display
- 3.5-inch (diagonal) widescreen multi-touch display
- 800:1 contrast ratio (typical)
- 500 cd/m2 max brightness (typical)
- Fingerprint-resistant oleophobic coating on front and back
- Support for display of multiple languages and characters simultaneously
- 5-megapixel iSight camera
- Video recording, HD (720p) up to 30 frames per second with audio
- VGA-quality photos and video at up to 30 frames per second with the front camera
- Tap to focus video or still images
- LED flash
- Photo and video geotagging
- Built-in rechargeable lithium-ion battery
- Charging via USB to computer system or power adapter
- Talk time: Up to 20 hours on 3G, up to 14 hours on 2G (GSM)
- Standby time: Up to 300 hours
- Internet use: Up to 6 hours on 3G, up to 10 hours on Wi-Fi
- Video playback: Up to 10 hours
- Audio playback: Up to 40 hours
- Frequency response: 20 Hz to 22,000 Hz
- Audio formats supported: AAC (8 to 320 Kbps), protected AAC (from iTunes Store), HE-AAC, MP3 (8 to 320 Kbps), MP3 VBR, audible (formats 2, 3, 4, audible enhanced audio, AAX, and AAX+), Apple lossless, AIFF, and WAV
- User-configurable maximum volume limit
- Video out support with Apple digital AV adapter or Apple VGA adapter; 576p and 480p with Apple component AV cable; 576i and 480i with Apple composite AV cable (cables sold separately)
- Video formats supported: H.264 video up to 1080p, 30 frames per second, main profile Level 3.1 with AAC-LC audio up to 160 Kbps, 48 kHz, stereo audio in .m4v, .mp4, and .mov file formats; MPEG-4 video up to 2.5 Mbps, 640 by 480 pixels, 30 frames per second, simple profile with AAC-LC audio up to 160 Kbps per channel, 48 kHz, stereo audio in .m4v, .mp4, and .mov file formats; motion JPEG (M-JPEG) up to 35 Mbps, 1280 by 1020 pixels, 30 frames per second, audio in ulaw, PCM stereo audio in .avi file format:
- Three-axis gyro
- Accelerometer
- Proximity sensor
- Ambient light sensor
- etcetera.

Embodiments of the present disclosure may be used with other electronic devices. Examples of suitable electronic devices include a portable electronic device such as a media player, a cellular phone, a personal data organizer, or the like. In such embodiments, a portable electronic device may include a combination of the functionalities of such devices. In addition, an electronic device may allow a user to connect to and communicate through the Internet or through other networks such as local or wide area networks. For example, a portable electronic device may allow a user to access the internet and to communicate using e-mail, text messaging, instant messaging, or using other forms of electronic communication. By way of example, the electronic device may be similar to an iPod having a display screen or an iPhone available from Apple Inc.

In certain embodiments, a device may be powered by one or more rechargeable and/or replaceable batteries. Such embodiments may be highly portable, allowing a user to carry the electronic device while traveling, working, exercising, and so forth. In this manner, and depending on the functionalities provided by the electronic device, a user may listen to music, play games or video, record video or take pictures, place and receive telephone calls, communicate with others, control other devices (e.g., via remote control and/or Bluetooth functionality), and so forth while moving freely with the device. In addition, the device may be sized such that it fits relatively easily into a pocket or the hand of the user. While certain embodiments of the present disclosure are described with respect to portable electronic devices, it should be noted that the presently disclosed techniques may be applicable to a wide array of other, less portable, electronic devices and systems that are configured to render graphical data such as a desktop computer.

As shown, FIG. 8H includes a system diagram with a smart phone that includes an LED according to an embodiment of the present disclosure. The smart phone 8H06 is configured to communicate with a server 8H02 in electronic communication with any forms of handheld electronic devices. Illustrative examples of such handheld electronic devices can include functional components such as a processor 8H08, memory 8H10, graphics accelerator 8H12, accelerometer 8H14, communications interface 8H11 (possibly including an antenna 8H16), compass 8H18, GPS chip 8H20, display screen 8H22, and an input device 8H24. Each device is not limited to the illustrated components. The components may be hardware, software or a combination of both.

In some examples, instructions can be input to the handheld electronic device through an input device 8H24 that instructs the processor 8H08 to execute functions in an electronic imaging application. One potential instruction can be to generate an abstract of a captured image of a portion of a human user. In that case the processor 8H08 instructs the communications interface 8H11 to communicate with the server 8H02 (e.g., possibly through or using a cloud 8H04) and transfer data (e.g., image data). The data is transferred by the communications interface 8H11 and either processed by the processor 8H08 immediately after image capture or stored in memory 8H10 for later use, or both. The processor 8H08 also receives information regarding the display screen's attributes, and can calculate the orientation of the device, e.g., using information from an accelerometer 8H14 and/or other external data such as compass headings from a compass 8H18, or GPS location from a GPS chip 8H20, and the processor then uses the information to determine an orientation in which to display the image depending upon the example.

The captured image can be rendered by the processor 8H08, by a graphics accelerator 8H12, or by a combination of the two. In some embodiments, the processor can be the graphics accelerator 8H12. The image can first be stored in memory 8H10 or, if available, the memory can be directly associated with the graphics accelerator 8H12. The methods described herein can be implemented by the processor 8H08, the graphics accelerator 8H12, or a combination of the two to create the image and related abstract. An image or abstract can be displayed on the display screen 8H22.

Figure 8I:
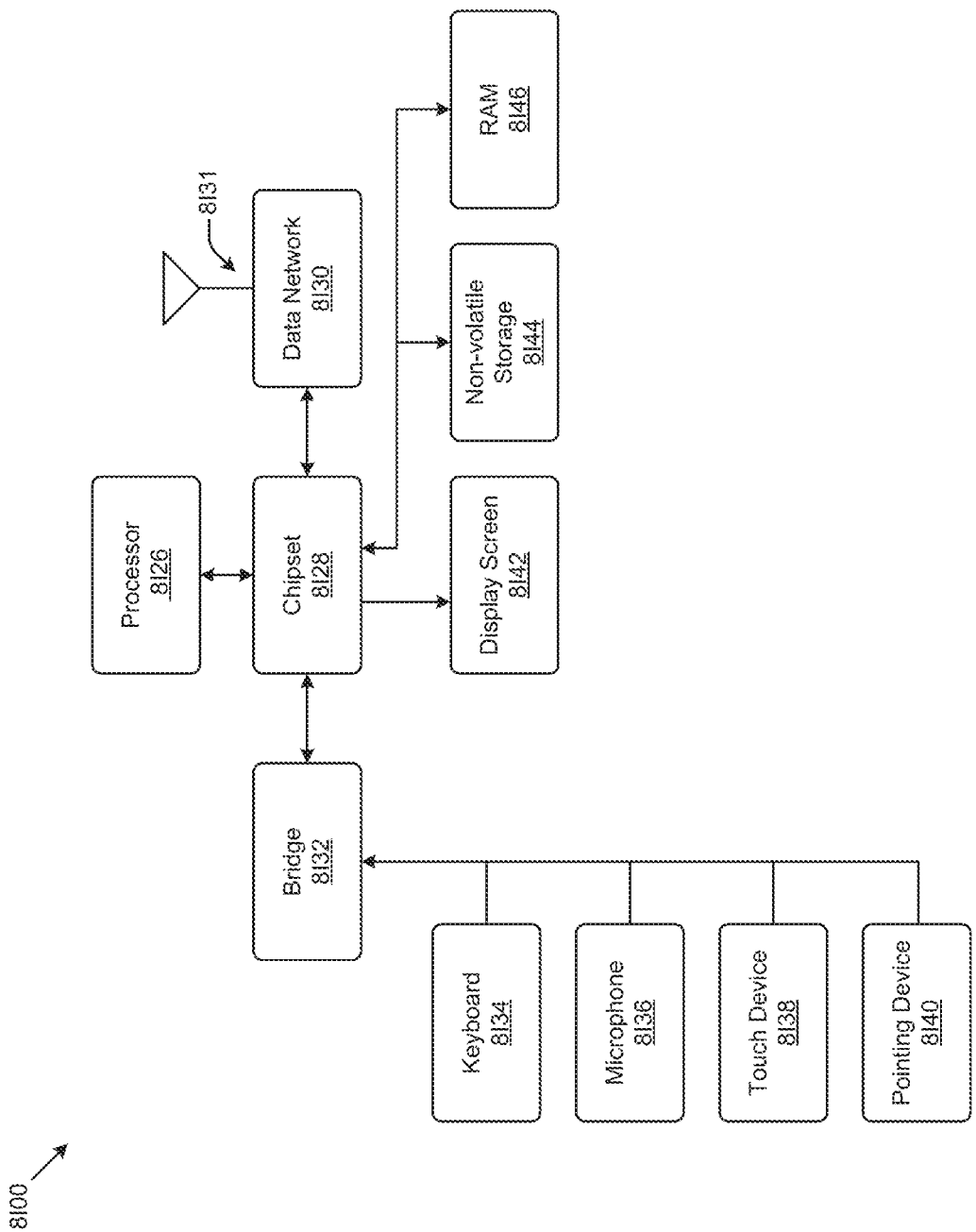

FIG. 8I depicts an interconnection of components in an electronic device 8I00. Examples of electronic devices include an enclosure or housing, a display, user input structures, and input/output connectors in addition to the aforementioned interconnection of components. The enclosure may be formed from plastic, metal, composite materials, or other suitable materials, or any combination thereof. The enclosure may protect the interior components of the electronic device from physical damage, and may also shield the interior components from electromagnetic interference (EMI).

The display may be a liquid crystal display (LCD), a light-emitting diode (LED) based display, an organic light-emitting diode (OLED) based display, or some other suitable display. In accordance with certain embodiments of the present disclosure, the display may display a user interface and various other images such as logos, avatars, photos, album art, and the like. Additionally, in certain embodiments, a display may include a touch screen through which a user may interact with the user interface. The display may also include various functions and/or system indicators to provide feedback to a user such as power status, call status, memory status, or the like. These indicators may be incorporated into the user interface displayed on the display.

In certain embodiments, one or more of the user input structures can be configured to control the device such as by controlling a mode of operation, an output level, an output type, etc. For instance, the user input structures may include a button to turn the device on or off. Further, the user input structures may allow a user to interact with the user interface on the display. Embodiments of the portable electronic device may include any number of user input structures including buttons, switches, a control pad, a scroll wheel, or any other suitable input structures. The user input structures may work with the user interface displayed on the device to control functions of the device and/or any interfaces or devices connected to or used by the device. For example, the user input structures may allow a user to navigate a displayed user interface or to return such a displayed user interface to a default or home screen.

Certain device may also include various input and output ports to allow connection of additional devices. For example, a port may be a headphone jack that provides for the connection of headphones. Additionally, a port may have both input and output capabilities to provide for the connection of a headset (e.g., a headphone and microphone combination). Embodiments of the present disclosure may include any number of input and/or output ports such as headphone and headset jacks, universal serial bus (USB) ports, IEEE-1394 ports, and AC and/or DC power connectors. Further, a device may use the input and output ports to connect to and send or receive data with any other device such as other portable electronic devices, personal computers, printers, or the like. For example, in one embodiment, the device may connect to a personal computer via an IEEE-1394 connection to send and receive data files such as media files.

The depiction of an electronic device 8I00 encompasses a smart phone system diagram according to an embodiment of the present disclosure. The depiction of an electronic device 8I00 illustrates computer hardware, software, and firmware that can be used to implement the disclosures above. The shown system includes a processor 8126, which is representative of any number of physically and/or logically distinct resources capable of executing software, firmware, and hardware configured to perform identified computations. A processor 8126 communicates with a chipset 8128 that can control input to and output from processor 8126. In this example, chipset 8128 outputs information to display screen 8142 and can read and write information to non-volatile storage 8144, which can include magnetic media and solid state media, and/or other non-transitory media, for example. Chipset 8128 can also read data from and write data to RAM 8146. A bridge 8132 for interfacing with a variety of user interface components can be provided for interfacing with chipset 8128. Such user interface components can include a keyboard 8134, a microphone 8136, touch-detection-and-processing circuitry 8138, a pointing device 8140 such as a mouse, and so on. In general, inputs to the system can come from any of a variety of machine-generated and/or human-generated sources.

Chipset 8128 also can interface with one or more data network interfaces 8130 that can have different physical interfaces. Such data network interfaces 8130 can include interfaces for wired and wireless local area networks, interfaces for broadband wireless networks, as well as personal area networks. Some applications of the methods for generating, displaying and using the GUI disclosed herein can include receiving data over a physical interface 8131 or be generated by the machine itself by a processor 8126 analyzing data stored in non-volatile storage 8144 and/or in memory or RAM 8146. Further, the machine can receive inputs from a user via devices such as a keyboard 8134, microphone 8136, touch-detection-and-processing circuitry 8138, and pointing device 8140 and execute appropriate functions such as browsing functions by interpreting these inputs using processor 8126.

What is claimed is:

1. A method for controlling oxygen concentration levels of reflective and electrically conductive Ag-based contacts of an optoelectronic semiconductor device, the method comprising:
    depositing a metallic stack on a semiconductor plane of the optoelectronic semiconductor device, the stack comprising at least one silver layer and at least one layer of an oxygen-gettering metal;
    introducing a predetermined dose of oxygen into the metallic stack; and
    annealing the optoelectronic semiconductor device to diffuse the oxygen-gettering metal to interfaces of the semiconductor plane and the metallic stack, wherein the oxygen is diffused to the interface.

2. The method of claim 1, wherein the oxygen-gettering metal is nickel.

3. The method of claim 1, wherein the dose of oxygen is introduced by flowing a controlled amount of oxygen into an annealing chamber during the annealing step.

4. The method of claim 1, wherein the oxygen is introduced by applying an oxygen-containing chemical onto the metallic stack.

5. The method of claim 1, wherein the oxygen is introduced by applying an oxygen-depositing treatment onto the metallic stack.

6. The method of claim 1, wherein the oxygen is introduced during a metal stack deposition step.

7. The method of claim 1, wherein the metallic stack comprises a first silver layer, and at least a nickel layer formed on top of the silver layer.

8. The method of claim 7, further comprising a second silver layer formed on top of the at least one nickel layer.

9. The method of claim 1, further comprising controlling a timing and a rate of release of a controlled amount of the dose of oxygen.

10. The method of claim 1, further comprising depositing a layer of titanium on top of the metal stack.

11. The method of claim 1, wherein the semiconductor comprises a gallium and nitrogen-containing semiconductor material.

12. The method of claim 1, further comprising performing an electrical measurement on the optoelectronic semiconductor device to determine effects of the oxygen dose.

13. The method of claim 1, wherein the fraction of the oxygen-gettering metal and of the oxygen form a metal oxide at the at least one interface.

14. A method for controlling oxygen concentration levels of reflective and electrically conductive Ag-based contacts of an optoelectronic semiconductor device, comprising:
    providing a gallium and nitrogen-containing semiconductor device;
    depositing a first silver layer on at least one surface of the semiconductor;
    depositing a nickel layer on the first silver layer;
    depositing a second silver layer on the nickel layer; and
    annealing the device in an oxygen-containing ambient environment to introduce a predetermined dose of oxygen into the optoelectronic semiconductor device and to diffuse at least a portion of nickel in the nickel layer and the oxygen through the first silver layer to the at least one surface.

15. A method for forming a reflective and electrically conductive Ag-based electrical contact on an optoelectronic semiconductor device, the method comprising:
    depositing an electrical contact metal stack on a semiconductor plane of the device for powering the device, the stack comprising at least one silver layer and at least one layer of an oxygen-gettering metal;
    introducing a predetermined dose of oxygen into the stack; and
    annealing the device to diffuse at least a portion of the oxygen-gettering metal and the oxygen to at least one interface of the semiconductor plane and the stack.

16. The method of claim 15, wherein the optoelectronic device is a light-emitting diode.

17. The method of claim 15, wherein the oxygen-gettering metal is nickel.

18. The method of claim 15, wherein the oxygen is introduced by applying an oxygen-depositing treatment to the stack.

19. The method of claim 15, wherein the metal stack comprises a first silver layer, a nickel layer formed on top of the silver layer, and a second silver layer formed on top of the nickel layer.

20. The method of claim 15, further comprising controlling a timing and rate of release of a controlled dose of oxygen.

21. The method of claim 15, wherein the semiconductor comprises a gallium and nitrogen-containing semiconductor material.

22. The method of claim 15, wherein the fraction of the oxygen-gettering metal and of the oxygen form a metal oxide at the at least one interface.

* * * * *